US005555306A

United States Patent [19]

Gerzon

[11] Patent Number: 5,555,306

[45] Date of Patent: Sep. 10, 1996

[54] AUDIO SIGNAL PROCESSOR PROVIDING SIMULATED SOURCE DISTANCE CONTROL

[75] Inventor: Michael A. Gerzon, Jericho, Great Britain

[73] Assignee: Trifield Productions Limited, London, England

[21] Appl. No.: 495,712

[22] Filed: Jun. 27, 1995

Related U.S. Application Data

[63] Continuation of Ser. No. 863,669, Apr. 6, 1992, abandoned.

[30] Foreign Application Priority Data

Apr. 4, 1991 [GB] United Kingdom .................. 9107011

[51] Int. Cl.[6] .................. H03G 3/00

[52] U.S. Cl. .................. 381/63; 84/630

[58] Field of Search .................. 381/63, 61; 84/630, 84/703

[56] References Cited

U.S. PATENT DOCUMENTS

| | | | |
|---|---|---|---|
| 4,181,820 | 1/1980 | Blesser et al. | 381/63 |
| 4,731,848 | 3/1988 | Kendall et al. | 381/63 |
| 5,025,472 | 6/1991 | Shimizu et al. | 381/63 |
| 5,027,689 | 7/1991 | Fujimori | 84/622 |
| 5,040,219 | 8/1991 | Ando et al. | 381/63 |
| 5,146,507 | 9/1992 | Satoh et al. | 381/63 |

FOREIGN PATENT DOCUMENTS

| | | | |
|---|---|---|---|
| 0079095 | 3/1990 | Japan | 84/630 |
| 0132493 | 5/1990 | Japan | 84/630 |

*Primary Examiner*—William Cumming
*Assistant Examiner*—Ping W. Lee
*Attorney, Agent, or Firm*—Baker & Daniels

[57] ABSTRACT

An audio signal processing system produces an output 24 having an illusory distance effect for a sound source signal S by feeding it via a direct signal path 25 and an indirect signal path 22, 23 passing through early reflection simulation apparatus 1 which feed an output mixing mechanism 9. A control system adjusts the relative delays 3, 4 and relative gains 5, 6 in the direct 25 and indirect 22, 23 signal paths to modify the illusory distance effect so as to substantially maintain the mathematical relationship between the gains and time delays of simulated reflections relative to first sound arrivals at the output 24 encountered for sounds at that source distance in actual rooms. Signal paths 22, 23, 24, 25 may be stereophonic or multichannel using matrix gain coefficients in the early reflection simulator 1, and may produce different simulated distances for different sound positions. A plurality of sound sources S may have different simulated distances while feeding a common early reflection simulator 1.

39 Claims, 6 Drawing Sheets

AUDIO SIGNAL PROCESSOR PROVIDING SIMULATED SOURCE DISTANCE CONTROL

This is a continuation of patent application Ser. No. 07/863,669, filed Apr. 6, 1992, now abandoned.

BACKGROUND OF THE INVENTION

1. Field of the Invention

This invention relates to methods of sound production and reproduction wherein it is desired to create an illusion of a desired apparent sound source distance from a listener.

2. Description of the Prior Art

Many cues are known that help to create the illusion of a sound source having a given apparent distance, but hitherto, no satisfactory means of simulating the illusion of sound source distance reliably has been known, although various means have been proposed and used to obtain a somewhat unreliable simulation of a distance effect.

Among cues that have been used are reproduced sound source loudness, reproduced sound source equalisation, reproduced ratio of direct to reverberant sound, and reproduced phase distortion.

It is found that in many rooms with good acoustics, it is possible for listeners to reliably discriminate the apparent distance of an actual sound source. Unpublished experiments-by James A. Moorer at Bell Labs in New Jersey, U.S.A. in the late 1970's showed that a convincing illusion of apparent sound source distance could be simulated by computing and reproducing the sounds of just five early reflections that would be produced in a computer-modelled room by an anechoically-recorded sound. Thus, in the prior art, it is known that simulation of actual or computed early reflections in a room can be used to simulate sound source distance effects.

However, in sound recording applications, the simulation of actual early room reflections has numerous problems, since each different sound source position and distance requires the computation of a new set of reflections, and one is confined to simulating position within a given simulated room with a given acoustical character. Simulating only a few reflections is liable to cause a sound with a high degree of comb-filter colouration, and when mixing a large number of sound sources, e.g. from a 48-track tape recorder, a very large amount of computation is required to simulate a different distance for each source, since each requires a different early reflection simulation.

SUMMARY OF THE INVENTION

It is an object of the present invention to provide a simulation of sound source distance localisation cues including simulated early reflection distance cues having relatively low signal processing complexity when used with multiple input sound source signals, and which is applicable either to monophonic or to stereo sound source signals.

It is another object of the invention to provide sound source distance simulation using simulated early reflection cues for stereophonic signals whereby the monophonic reproduction of said stereophonic signals retains the illusory distance effect.

According to the invention, there is provided audio signal processing means responsive to one or more input audio signals and providing one or more output signals producing a simulated distance effect, said signal processing means comprising output mixing means providing said output signals and early reflection simulation means feeding said output mixing means, said output mixing and early reflection simulation means being responsive to said input signals, wherein each simulated reflection of said reflection simulation means has an energy gain characteristic of the time delay of said simulated reflection and of a first predetermined sound source distance, and whereby each of said input signals is fed to said output mixing means via a first time delay means and a first gain means and to said early reflection simulation means via a second time delay means and second gain means, wherein one of said two gain means and one of said two time delay means may be trivial, i.e. of unit gain and zero delay respectively, and wherein the time delay of said first time delay means minus that of said second time delay means, all multiplied by the speed of sound in air, is equal to the predetermined intended sound source distance for said input signal minus said first predetermined sound source distance, and whereby the magnitude of said first gain divided by said second gain is substantially equal to the ratio of said predetermined intended sound source distance to said first predetermined sound source distance multiplied by a predetermined sound absorption constant which may be dependent on frequency, raised to the power of said difference of time delays.

The invention allows a single or small number of early reflection simulation means to be used in conjunction with adjustable time delay and gain means associated with individual input sources to provide an illusion of a larger number of sound source distances, thereby reducing the complexity of the signal processing.

The invention works not by accurately simulating actual early reflections of sound sources in an actual or theoretically modelled room, but by providing those cues used by the ears and brain to deduce sound source distance from early reflections.

To understand the invention, consider a room having a number of nonabsorbing plane reflecting surfaces. Using ray theories of acoustics, an omnidirectionally radiating sound source at distance d from a listening position will be heard accompanied by delayed reflections from virtual sound sources at larger distances d' with time delay $$T=c^{-1}(d'-d) \tag{1}$$

where c is the speed of sound in air (about 340 m/s), and amplitude gain relative to the direct sound $$g=d/d'. \tag{2}$$

Given a knowledge of T and g obtained from transients in the received sound, d can be computed from $$d=cT/(g^{-1}-1), \tag{3}$$

and it is thought that this is broadly how the ears and brain use early reflections to determine distance.

Every additional nonoverlapping sound reflection allows an additional estimation of d from the associated values of T and g, so that the reliability of such distance perception will increase with the number of early reflections except if two or more reflections overlap in time, in which case, equation (2) fails to hold. Thus early reflection cues help determine distance provided that reflection density is not too high and that one is not in a room position, such as symmetrical positions in a room, at which such overlap of two reflections occurs.

Actual rooms have air absorption and nonplanar surfaces with absorption, resonances and dispersion, and sound sources are not omnidirectional at high frequencies. Some of these factors can be allowed for by assuming a constant absorption r per unit time delay of travel of sounds, so that equation (2) is modified to $$g=(d/d')e^{-rT}. \quad (4)$$

Such constant absorption per unit delay applies to air absorption and, in the limit of many reflections, to room boundary absorption. It is possible to show that constant absorption per unit delay is associated with every room resonance having an identical decay time, which is known, at least within each of the ear's critical bands, to be a desirable characteristic of good room acoustics. The absorption-per unit time will, in general, be dependent on frequency, increasing at higher audio frequencies.

Given an unknown absorption r per unit delay, equations (1) and (4) can be solved for d given T and g for at least two early reflections. In the case that r varies for individual reflections and for directional sound sources, d can be determined from a larger number of reflections, for example by a least squares fit method.

From equations (1) and (4), a simulated early reflection in, for example, a digital signal processing apparatus, will best contribute to a sense of sound source distance d if a simulated reflection delayed by time T after the direct sound output is given a gain, as a proportion of the direct sound output gain, equal to $$g=[1/(1+cT/d)]e^{-rT}. \quad (5)$$

Conventional studio methods of simulating distance by sending signals via auxiliary send feeds to digital reverberators with early reflection simulation do not work well because they modify the gains of all simulated early reflections equally independent of their time delay.

However, by modifying both the relative gains and the relative time delays of the direct sound and that fed to an early reflection simulation means satisfying equation (5) for a predetermined first sound source distance d, it is possible to create the effect of a modified sound source distance d+δ. To see this, note that $$\left[\frac{1}{1+\frac{c(T-\delta/c)}{d+\delta}}\right]e^{-r(T-\delta/c)}=\left\{\frac{d+\delta}{d}\,e^{r\delta/c}\right\}\left[\frac{e^{-rT}}{1+cT/d}\right]. \quad (6)$$

Thus any early reflection cue with amplitude gain consistent with distance d according to equation (5) can be converted to one consistent with distance d+δ by reducing the relative time delay of all such simulated reflections by δ/c and multiplying the relative gain of all such simulated reflections by $$(1+\delta/d)e^{r\delta/c}. \quad (7)$$

For example, this may be achieved by passing the direct sound signal through an additional time delay $$\delta/c \quad (8)$$

and a gain $$\frac{d}{d+\delta}\,e^{-r\delta/c}. \quad (9)$$

Other aspects, embodiments, objects and advantages of the invention will be apparent from the description.

Embodiments of the invention will now be described by way of example with reference to the accompanying drawings in which:

A BRIEF DESCRIPTION OF THE DRAWINGS

BRIEF DESCRIPTION OF A PREFERRED EMBODIMENT

Figure 1:
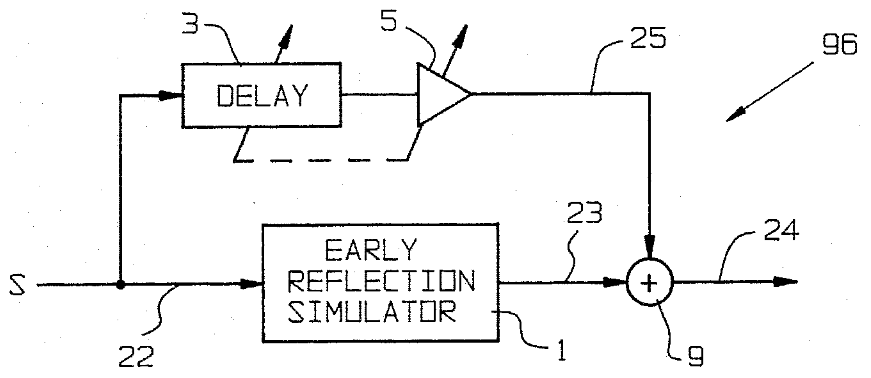
FIG. 1 shows an example of the invention in which apparent distance is adjusted by means of gain and time delay in the direct signal path.

Referring to FIG. 1, an early reflection simulation means 1 providing simulated reflection cues consistent with a predetermined first sound source distance d is fed at its input 22 with an input source audio signal S, which is also fed 25 via a delay means 3 and gain means 5 to an output summing or mixing means 9, which is also fed with the output 23 of said early reflection simulation means 1. According to the invention, the output 24 of said mixing means 9 provides an apparent sound source distance d+δ if the delay of the delay means 3 is given by equation (8) and if the amplitude gain of the gain means 5 is given by equation (9).

In order to provide the correct first arrival signal to provide the intended distance effect, it is necessary that the simulated distance be limited to values such that the delay of the delay means 3 is less than the delay of the first simulated reflection produced by the reflection simulation means 1.

The time delay means 3 and gain means 5 may be simultaneously adjustable according to equations (8) and (9) by means of a user control means (not shown) which may be calibrated with apparent source distance, or may produce ikons on a visual display means which vary in apparent visual distance to match the intended sound source distance.

The method of distance adjustment shown in FIG. 1 and according to equations (8) and (9) has the advantage that, as the intended sound source distance d+δ is increased, the direct sound gain 5 diminishes to the same extent as the direct sound gain from an actual sound source of similar distance would. If the absorption per unit delay r is frequency dependent, then the gain means 5 will also be frequency dependent and implemented by filtering means, so that the tonal quality of the direct sound will vary with distance.

However, in many applications, such variations of direct source loudness and tonal quality with distance is not desired. For example, a satisfactory reproduction level may already have been chosen, and it may be desired to alter apparent distance with little effect on the chosen level.

Figure 2:
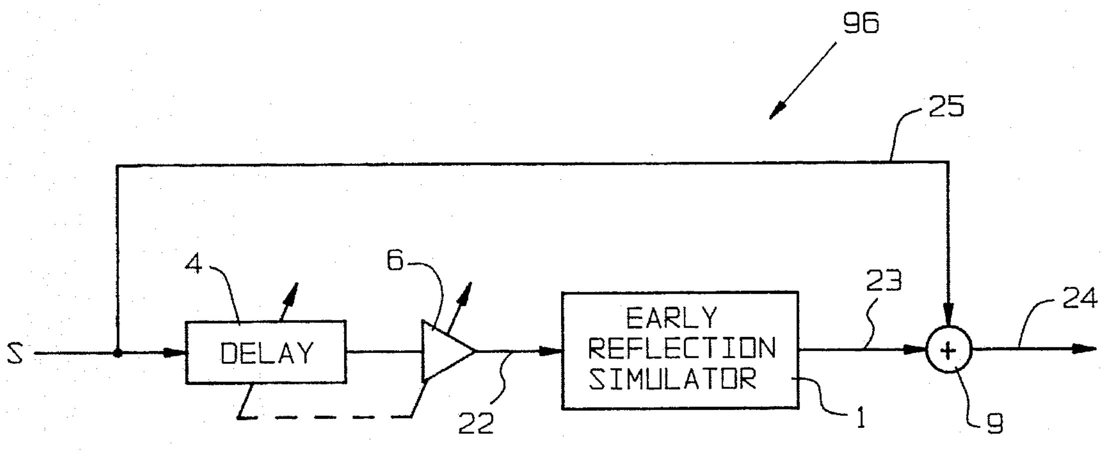
FIG. 2 shows an example of the invention in which apparent distance is adjusted by means of gain and time delay in the simulated reflection signal path.

FIG. 2 illustrates a second example of the invention in which the input signal S is fed without gain or time delay modification via a direct signal path 25 to an output mixing means 9, and in which said input S is also fed via a time delay means 4 and gain means 6 into an early reflection simulation means 1 whose output 23 is fed into said output mixing means 9. If said early reflection simulation means 1 is such as to provide simulated reflection cues consistent with a distance d, then via equations (6) to (9), cues consistent with a sound source distance d−δ will be provided if the delay means 4 has time delay $$\delta/c \tag{10}$$

and the gain means 6 has gain $$\frac{d-\delta}{d}\,e^{-r\delta/c}. \tag{11}$$

As in the case with FIG. 1, control means allowing simultaneous adjustment of delay 4 and gain 6 means according to equations (10) and (11) may be provided.

Figure 3:
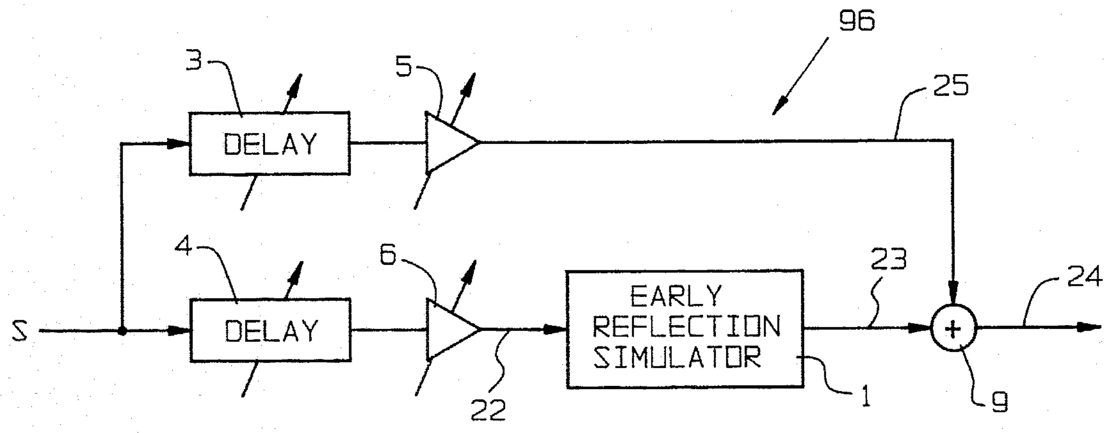
FIG. 3 shows an example of the invention using gain and time delay adjustment in both signal paths.

More generally, any desired overall signal level may be provided by using an implementation of the invention shown in FIG. 3 in which an input source signal S is fed via first time delay means 3 and gain means 5 via a direct signal path 25 to output mixer means 9 and via a second delay time delay means 4 and gain means 6 via an indirect signal path 22 feeding an early reflection simulation means 1 whose output 23 feeds said output mixer means 9, which provides an output 24 having a simulated distance effect.

According to this example of the invention, if the early reflection simulation means 1 provides simulated early reflection cues consistent with a sound source distance d, then the method of FIG. 3 provides cues consistent with a distance d+δ, where δ may have any value larger than −d and smaller than the time delay of the first simulated reflection in said simulation means 1, provided that the respective time delays $T_1$ and $T_2$ of said first and second time delay means 3 and 4 and the respective gains $g_1$ and $g_2$, which may be frequency dependent, of said first and second gain means 5 and 6 substantially satisfy:

$$T_1-T_2=\delta/c \tag{12}$$

and $$g_1/g_2=\frac{d}{d+\delta}\,e^{-r\delta/c}. \tag{13}$$

As before, distance control adjustment means ensuring simulated distance d+δ by satisfying equations (12) and (13) may be provides, and control means can also be provided to vary the law by which the direct path 25 sound gain $g_1$ of gain means 5 varies with distance.

In many cases in the implementation of the form of FIG. 3, one of the delay means 3 or 4 and one of the gain means 5 or 6 may be trivial, where a trivial delay is a zero delay, and a trivial gain is a unit gain. Such trivial delays help to minimise the overall time delay of passage of signals through the signal processing means of FIG. 3.

A more general implementation of the invention may use an early reflection simulation means 1 in the arrangements of FIGS. 1, 2 or 3, in which some or all of the initial delay of the simulation means (defined as that delay prior to the first simulated reflection) may be removed from the simulation means and added to delay means 4, subtracted from delay means 3, or apportioned so that some of said removed initial delay is apportioned to additional delay in delay means 4 and the rest to a reduction of delay in delay means 3.

Additionally, still within the scope of the invention, an overall gain factor,which may be frequency-dependent, may be removed (i.e. divided out) from the gains of all simulated reflection in the simulation means 1, and apportioned as a multiplicative factor in gain means 6 and a division factor in gain means 5.

Such reapportioning of overall gain and delay factors in the early reflection simulation means 1 initially desgned to provide cues consistent with a perceived distance d, to the time delay and gain means 3 to 6 does not affect the overall operation of the invention, apart from possibly changing the overall signal delay and equalisation of the output signal 24. Since early reflection distance cues described earlier are dependent on relative rather than absolute time delay and amplitude cues, such changes of overall delay and gain do not change simulated distance.

Figure 4:
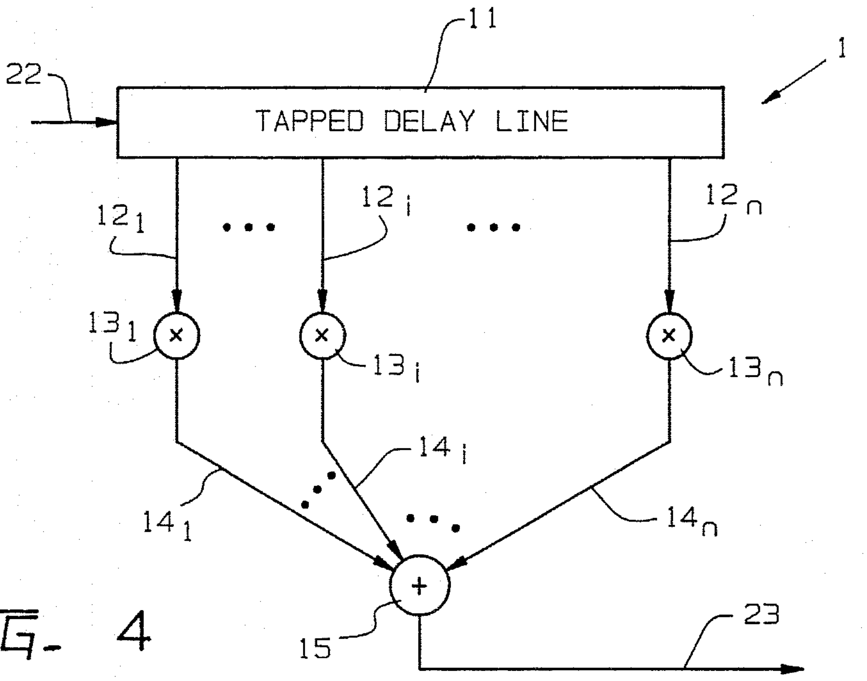
FIG. 4 shows a tapped delay line early reflection simulator.

A possible implementation of the early reflection simulation means 1 is shown in FIG. 4, in which the input 22 to the simulation means is fed to a tapped delay line whose n taps are given by gain adjustment means $13_i$ for the i'th tap gains $G_i$, which may be frequency dependent, the results $14_i$ of said gain adjustment means $13_i$ then being fed to an adding means 15 to provide a simulator output signal 23. Such a means is a transversal filter and may alternatively be implemented by any other known means for transversal filters.

If the early reflection simulation means of FIG. 4 is to provide cues consistent with a distance d, and if the i'th tap has time delay from the input $t_i$, then ideally, from equation (5), one should have:

$$G_i=\frac{e^{-rt_i}}{1+ct_i/d}\,. \tag{14}$$

If an initial delay $t_O$ and a gain factor $G_O$ are removed from the simulation means as described above, then the i'th tap has delay $t_i-t_O$ and gain $G_i'=G_i/G_0$. In order to simulate a distance d, it is not necessary for every tap gain to satisfy equation (14) exactly, since in real-world early reflections there are variations in gain due to differing absorption, dispersion, resonances and lack of flatness of reflecting surfaces. It is only necessary that the actual tap gains, measured on a logarithmic or dB scale, fluctuate around the general trend given by equation (14).

While the fluctuation of gain around the trend (14) have to be evaluated by subjective listening tests in which the degree of conviction of the depth cue is judged, relatively small degrees of fluctuation may be found better than larger degrees of fluctuation. In addition to possibly frequency-dependent tap gains $G_i$, each tap may also be provided with additional time dispersion, which in general will increase in magnitude with increasing tap delay $t_i$, to simulate dispersion and irregularities of reflecting surfaces. In general, simulating absorption and dispersion will reduce perceived colouration in simulated early reflections, but may degrade the reliability of subjective distance cues. At the current state of the art, the subjective quality of simulated early reflections must be determined by listening tests, as must the subjective effect of simulating dispersion.

It is found that objectionable comb filter colourations in simulated early reflections are not necessarily minimised by using a random choice of tap delays $t_i$. In natural early reflections, the density per unit time of reflections increases approximately as the square of elapsed time, although in simulated reflections for the purpose of providing distance cues, it may be preferred to provide a slower increase of density in order to prevent overlap of reflections, which has been noted above as a cause of breakdown of the effectiveness of distance cues. In any case, it is believed that the time delays that contribute to the distance illusion will generally be within 50 or 80 milliseconds of the direct sound.

Stereophonic Case

In the above descriptions signals and signal paths can be interpreted as monophonic. However, the invention, and the interpretation of FIGS. 1 to 4 and the associated description need not be confined to monophonic signals or signal paths.

The simplest stereophonic extension of the invention interprets all signals and signal paths as stereophonic (which may be 2-channel or multichannel stereophony intended to cover a frontal stage or a surround sound stage), and all adding means, gain means, delay means and filter means are applied equally to all channels. In this simplest stereophonic case, all simulated reflections occur in the same stereophonic position as the original sound source positions.

However, it is known that the sound quality of simulated early reflections is much more natural and subjectively less coloured if different simulated reflections come from different stereophonic directions. Such different directions should ideally be related to, but not identical to, the direction of the original sound source. This may be achieved relatively simply in a tapped delay line early reflection simulation means of the kind illustrated in FIG. 4.

In a stereophonic early reflection simulation means implemented as in FIG. 4, an m-channel audio signal 22 enters m parallel tapped delay lines with n taps with delays $t_i$ (i=1 to n), the taps being at identical delays in all m parallel delay lines. The signal $\mathbf{12}_i$ from the i'th tap is also an m-channel signal, and the gain means $\mathbf{13}_i$ in this stereophonic case takes the form of an m×m matrix network having the property of having output signals $\mathbf{14}_i$ whose total energy is $G_i^2$ times the total energy of the signals $\mathbf{12}_i$, so that the gain means $\mathbf{13}_i$ constitutes in this case $G_i$ times a unitary or orthogonal m×m matrix means, which may be frequency-dependent. The matrix output signals $\mathbf{14}_i$ for i=1 to n are fed to m-channel adding means 15 to provide an m-channel simulator output signal 23.

The effect of incorporating an orthogonal or unitary m×m matrix component into the gain adjustment means $\mathbf{13}_i$ is to rotate or otherwise alter the stereophonic positions in the matrix output signals $\mathbf{14}_i$ so that they differ from the positions of the initial sounds in the input signals 22. For example, the i'th gain adjustment means $\mathbf{13}_i$ may, for 2-channel stereo signals, act on the signals $\mathbf{12}_i$ to produce the signals $\mathbf{14}_i$ by means of a 2×2 rotation matrix with gain $G_i$ of the form $$\begin{pmatrix} G_i\cos\theta_i & -G_i\sin\theta_i \\ G_i\sin\theta_i & G_i\cos\theta_i \end{pmatrix}, \tag{15}$$

where the gain $G_i$ may be frequency-dependent and of the form associated with the tap delay $t_i$ to give an impression of distance d as described in connection with the monophonic case, and where the rotation angle $\theta_i$ associated with the i'th tap rotates the position of the simulated reflection in the stereophonic image relative to the position of the sound source in the direct image. Alternatively, the gain adjustment means $\mathbf{13}_i$ may implement an orthogonal matrix with gain $G_i$ of the form $$\begin{pmatrix} G_i\cos\theta_i & G_i\sin\theta_i \\ G_i\sin\theta_i & -G_i\cos\theta_i \end{pmatrix} \tag{16}$$

of the "reflection about a line" kind, in which case a clockwise rotation of an input source image will cause a simulated reflection to rotate anticlockwise.

Additionally, if desired, m×m orthogonal or unitary matrices may be placed anywhere in the early reflection simulation means m-channel signal path without altering the apparent distance. Thus by incorporating orthogonal or unitary m×m matrices in association with the gain adjustment means $\mathbf{13}_i$ or elsewhere in the signal path, the stereophonic positions of different simulated reflections may be widely varied.

With even greater generality, the early reflection simulation means may have a greater number m' of output signal 23 channels than the number m of input signal 22 channels, by making the gain adjustment means $\mathbf{13}_i$ to be of the form $G_i$ times an m'×m matrix that preserves the total energy of m-channel signals passing through.

m-channel stereophonic early reflection simulation means with simulated reflection gains $G_i$ associated with a simulated distance d may be incorporated into m-channel stereo distance simulation means of the kind already described with reference to FIGS. 1, 2 and 3, using the same adjustments of the m-channel delay means 3 and 4 and of the m-channel gain means 5 and 6 already described. This allows the apparent distance of the whole stereophonic stage of an m-channel stereophonic source signal S to be chosen and adjusted.

Monophonic signals, or stereophonic signals originated for a smaller number m" of stereo channels, may be fed into an m-channel distance simulation network or means according to the invention using a panpot or m×m" matrix network or means to feed the initial signal into the m input signal paths 21 shown in FIGS. 1 to 3.

Multiple Input Sources

The above descriptions referred either to a single monophonic source or a single pre-mixed stereophonic soundstage source in which the whole stage is given cues associated with a single distance. With such single inputs, the time delay means 4 and the gain means 6 may individually or jointly be placed subsequent to the early reflection simulation means 1 in the signal path 25 rather than before said simulation means in the signal path 22, according to the invention, since it is evident to one skilled in the art that changing the order of a gain or delay with another linear process does not alter the overall performance.

Figure 5:
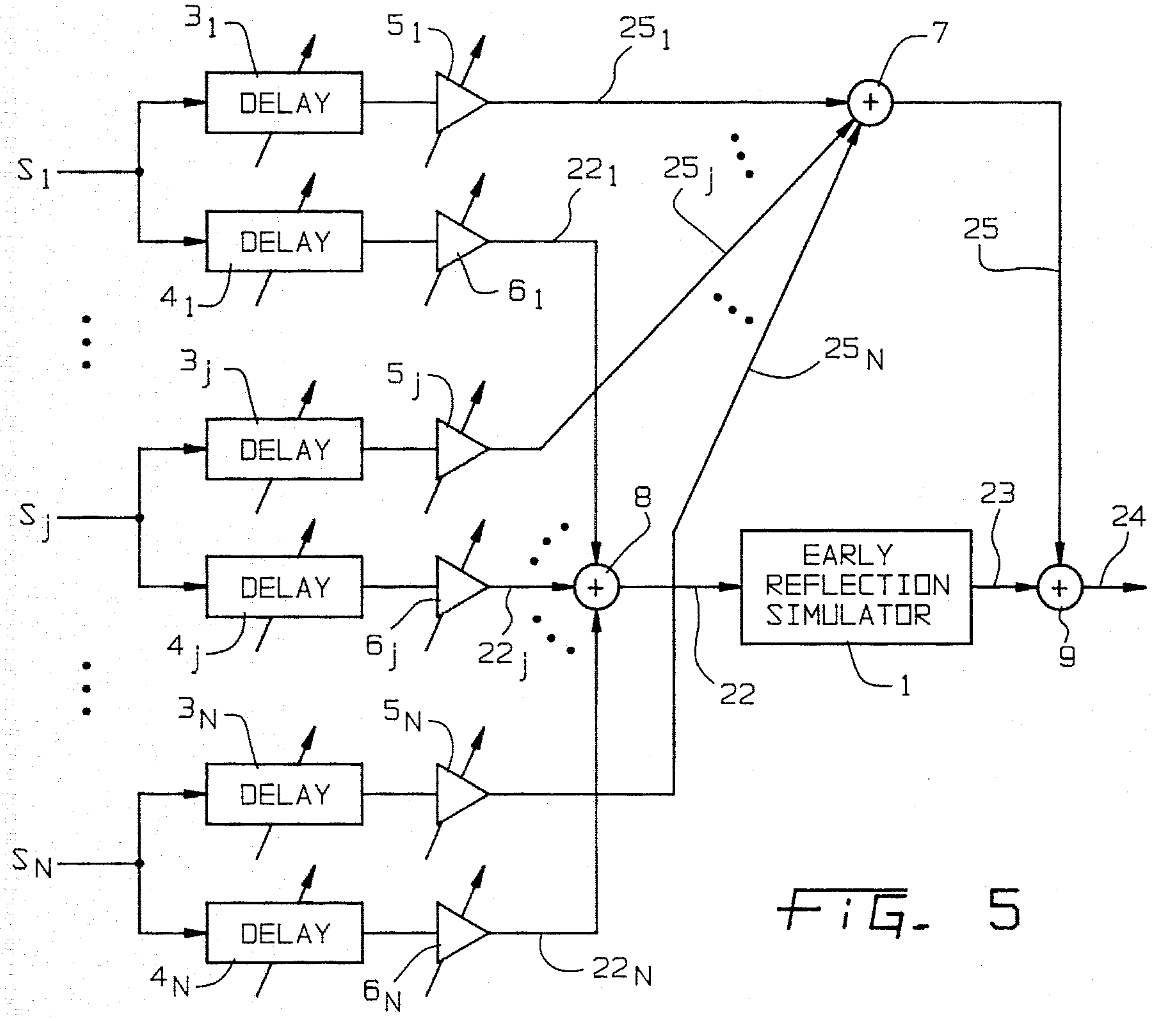
FIG. 5 shows an example of the invention with a plurality of input signal sources with individually adjustable simulated distance effect.

However, many advantages of the invention become apparent when a plurality of input sources $S_j$, with j=1 to N, which may be monophonic or stereophonic source signals, are to be mixed together and each given an individually predetermined illusory distance $d_j$. As illustrated in FIG. 5, a plurality N of input source signals $S_j$ are each individually provided with time delay means $3_j$ and $4_j$ and gain means $5_j$ and $6_j$, where one gain means and one delay means may be trivial,where the delay means $3_j$ and gain means $5_j$ provide a direct signal $25_j$ which, for all j=1 to N, is fed to a direct-path summing or mixing means 7 to provide a summed direct-path signal 25, and where the delay means $4_j$ and gain means $6_j$ in the indirect signal paths $22_j$ provide a signal $22_j$ which is fed to an indirect-path summing or mixing means 8 whose output 22 is fed to a single early reflection simulation means 1 providing an output signal 23, and the summed direct path signal 25 and the simulation output signal 23 are fed to output summing or mixing means 9 to provide an output signal 24 comprising a mix of the input source signals $S_j$ in which each has been provided with simulated early reflection cues consistent with individual sound source distances $d_j=d+\delta_j$, where d is a basic distance associated with said early reflection simulation means 1, and $\delta_j$ is a modification of said distance d provided by said delay means $3_j$ and $4_j$ and said gain means $5_j$ and $6_j$ in the manner already described in the individual-source case described above in connection with FIGS. 1 to 4.

The multi-source implementation of the invention shown in FIG. 5 allows many input source signals to be provided with individual distance cues associated with individually predetermined distances $d_j$ while using only a single early reflection simulation means 1 to provide early reflection cues. Hitherto, in the prior art, it had been necessary to provide a different early reflection simulation means for each different simulated distance provided for different sound sources mixed together, so that the invention allows a great simplification in the case when the plurality N of input signals is large, such as is the case in multitrack recording and mixdown in modern studio practice.

Various additional features may be provided to supplement features shown in the schematic of FIG. 5 for providing distance effects for each of a plurality of input sources without degrading the distance effect produced by the invention. For example, each input signal source $S_j$ may be provided with individual signal modification and processing means, such as gain controls, matrix means, equalisation, dynamic processing and panpots to position sounds prior Go being fed into means according to the schematic of FIG. 5.

Additionally or instead, any or each of the signal paths $22_j$ and $25_j$ may be provided with fixed or adjustable energy-preserving linear signal processing means with little time delay on transients without affecting the simulation of distance effect. For example, in a stereophonic system where the signal paths 22 to 25 are m-channel stereophonic, any or all of the input signal paths may be monophonic, or m"-channel stereophonic with m" less than m, and the signal paths $22_j$ and $25_j$ feeding respective mixing means 8 and 7 may incorporate panpots or m×m" matrix means to position the input signal $S_j$ within the m channels. Provided that said panpots or matrix means are such as to preserve the total signal energy passing through them (such as is the case with a 2-channel sine/cosine constant-power panpot), the relative levels and time delays of simulated early reflection responsible for the effect of a distance $d_j$ remain unchanged.

Thus, by way of example, the mixing means 7 or 8 may incorporate unit-gain constant--power positioning means such as sine/cosine panpot positioning means, for any or each of the input signals $25_j$ and $22_j$, without modifying the distance being simulated. By incorporating energy-preserving stereophonic positioning or modification means at or associated with the mixing or summing means 7 and 8, it is possible to arrange that the stereophonic relationship between the position of direct sound sources and their associated simulated early reflections is varied for individual sources, so as to reduce any possible artificial effect caused by applying too similar a processing to all input sources.

Energy-preserving linear signal processing means not introducing significant time delay or attenuation of transients may also be incorporated into the signal paths 22, 23 or 25 of FIGS. 1, 2, 3 or 5 without altering the simulated distance.

A means for controlling the apparent distance of a plurality of input source signals $S_j$ may, if desired, use more than one early reflection simulation means 1, with some input sources feeding one such means, some feeding other such means, and yet others feeding two or more such means, in order to provide a greater diversity of simulated reflections, where each of the simulation means 1 feeds into the output summing or mixing means 9. In the case where more than one early reflection simulation means is provided, the energy gain with which each is fed by an input source signal should be such as to ensure cues consistent with a predetermined distance $d_j$ for that source, as described earlier. When a given source is fed to two or more early reflection simulation means, care must be taken to ensure that the two means, and the associated gains and time delays with which they are fed by a source $S_j$, are such as to give cues consistent with the same distance $d_j$.

Mono Compatibility

A specific problem with a stereophonic implementation of the invention is that when a stereophonic output provides early reflection cues consistent with a sound source distance D, this is not generally the case when the stereo signals are reduced to mono by, for example, summing two stereo channels. This is because summing channels causes sounds panned in different stereo positions to be reproduced with different gains, so that simulated early reflections in stereo positions different from that of the direct sound may be given a mono relative gain different to that relative stereo gain responsible for the illustration of a specific distance.

In many applications, such as TV or film drama, it is desirable that the same sense of distance be heard both by monophonic and stereophonic listeners, and means of ensuring this according to the invention are described.

If all simulated reflections are arranged to be in the same stereophonic position as the associated source signal, as is the case with the simplest stereophonic extension of the invention described earlier, then the distance effect is retained in mono reproduction, since the relative gains of the direct sound and associated simulated reflections are preserved. However, this way of ensuring mono compatibility of the distance effect loses the subjective advantages of directional diversity of simulated reflections in stereo reproduction.

However, in stereo implementations of the invention according to FIGS. 1 to 3 or 5, in which all means (such as delay, gain and summing means) act separately on individual stereo channels, except for the early reflection simulation means 1, it is possible to design said simulation means 1 to be such as to automatically ensure mono compatibility of the distance effect.

Referring to FIG. 4, this may most simply be done by ensuring that each gain adjustment means $13_i$ is either a gain $G_i$ times an m×m identity matrix or a gain $G_i$ times an m×m matrix describing reflection of the stereophonic image about the forward axis. For 2-channel stereo with respective left and right signals L and R, this reflection matrix would have the form $$\begin{pmatrix} 0 & G_i \\ G_i & 0 \end{pmatrix}, \tag{17}$$

i.e. such that left and right channels are given gains $G_i$ and interchanged. Since the sum of stereo channels is unchanged by such left/right interchange, the mono compatibility of the distance effect is unchanged, while giving, for noncentral sound sources, some simulated relections at the same position as the sound source and some symmetrically disposed to the other side of the stereo image when reproduced in stereo. However, while better than all reflections coinciding with source position, this still gives poor diversity of simulated reflection position, and no diversity for sounds at the important central symmetrical stereo position.

Further improvement in directional diversity of simulated reflections with mono compatibility can be ensured if some of the stereophonic simulated reflections are placed in the antiphase stereo position having L=–R, since this position is cancelled out in mono reproduction and so does not affect perceived distance in mono.

Figure 6:
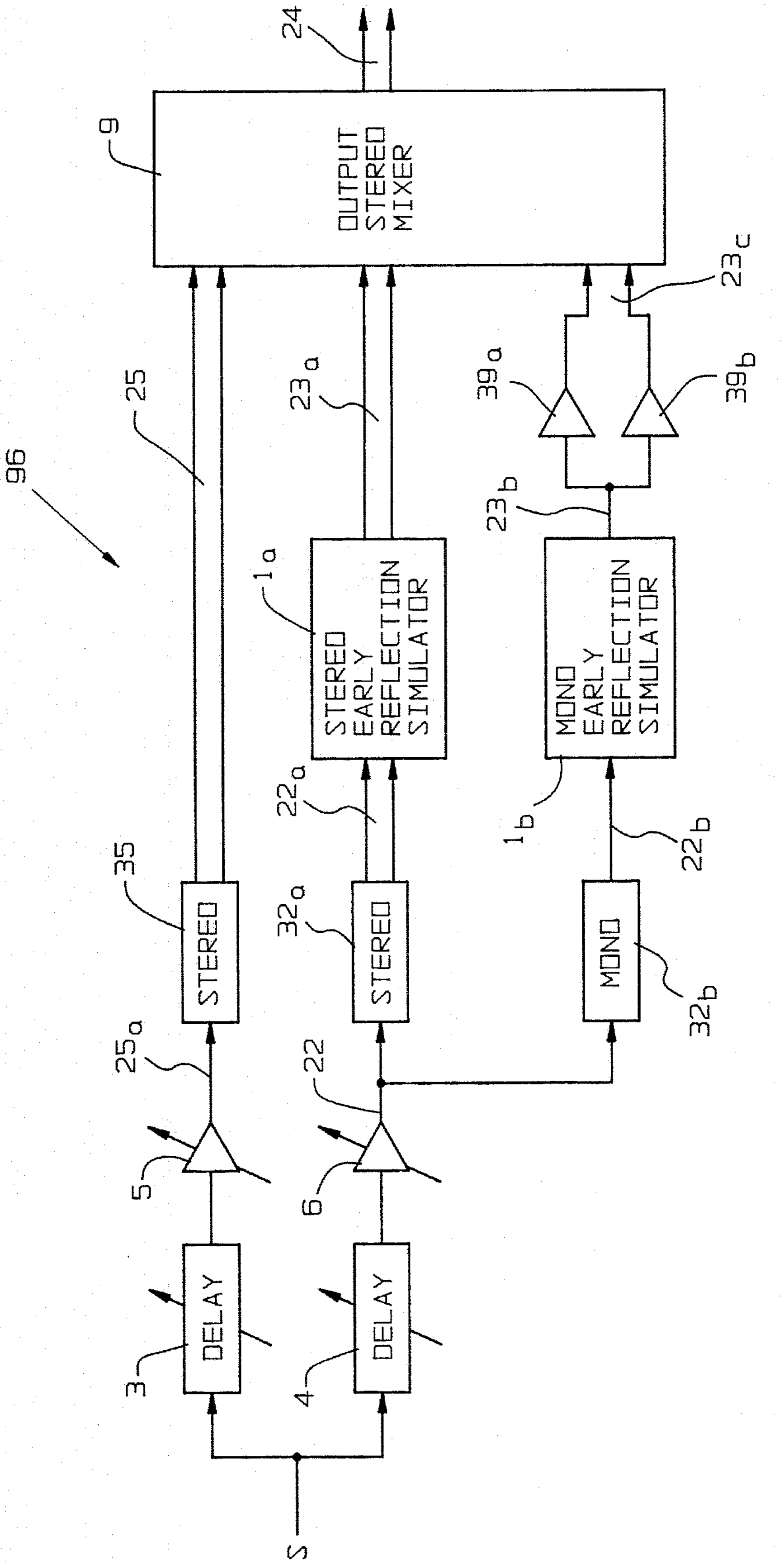
FIG. 6 shows a mono-compatible stereophonic example of the invention.

FIG. 6 illustrates an example of the invention providing mono compatibility of a simulated stereophonic distance effect using simulated antiphase reflections. In the same manner as described in connection with FIG. 3, an input source signal S, which may be monophonic or stereophonic, is passed via time delay means 3 and gain means 5 to provide a direct-path signal 25*a,* and passed through a time delay means 4 and gain means 6 to provide an indirect-path signal 22, where one of said delay means and one of said gain means may be trivial. The direct path signal 25*a* is then passed into a possibly trivial means 35 to create a stereo direct path signal 25 which is fed to an output stereo mixing means 9. The means 35 may, for example, be a constant-power sine/cosine panpot that positions a mono input source into the stereo stage, or may simply be a direct connection of a stereo signal.

The indirect-path signal 22 is passed into another stereo means 32*a,* which may be a stereo direct connection or an energy-preserving matrix means or constant power sine/cosine panpot for positioning a mono source within the stereo stage, and fed to a stereo early reflection simulation means 1*a* whose stereo output 23*a* comprises simulated delayed reflections that either lie in the same stereo position as its input 22*a,* or which lie in the left/right symmetrically disposed stereo position, as described earlier for mono compatibility, said simulation means 1*a* being such as to provide simulated reflection cues consistent with a source distance according to the invention, Its stereo output 23*a* is fed to said output stereo mixing means 9.

Figure 7:
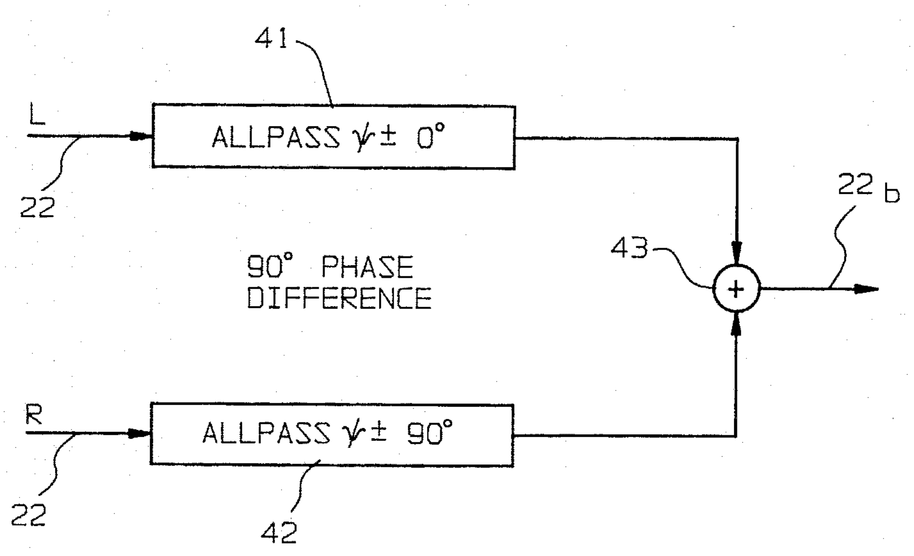
FIG. 7 shows a means of combining stereo channel signals to provide a mono signal with the same energy.

Additionally, said indirect path signal 22 is fed to a mono means 32*b* providing a monophonic output signal 22*b* having energy equal to that of the direct-path signal 22. The mono means 32*b* may be a direct signal feed if the source signal S is monophonic, and in the case of a stereophonic source signal using amplitude positioning of sounds, may comprise of the left and right channel signals added together after being given a relative 90° phase shift or Hilbert transform, such as shown in FIG. 7, where two all-pass phase shifters 41 and 42 acting on the left and right channel signals L and R respectively to provide a relative 90° phase difference, the output of said phase shifters being fed to adding means 43 to provide a monophonic output signal 22*b* having the same energy as the stereo input 22 when said stereo is created by amplitude positioning of sound.

Referring back to FIG. 6, the monophonic signal 22*b* derived from said mono means 32*b* is fed into a monophonic early reflection simulation means 1*b* providing early reflection cues consistent with a desired distance as previously described according to the invention, and the monophonic output 23*b* of said means 1*b* is converted into an antiphase stereo signal 23*c* of equal energy by being fed to two gains 39*a* and 39*b,* one of which equals $2^{-1/2}$ and the other of which equals $-2^{-1/2}$. The resulting antiphase stereo signal 23*c* is also fed to said output stereo mixing means 9, which provides a stereo output signal 24 which provides the desired distance effect both in stereo and in mono reproduction.

It is necessary that, for the distance effect to work well, the time delays of simulated reflections provided by simulation means 1*a* should differ from those of means 1*b* so that overlap of reflections does not occur.

The method shown in FIG. 6 and the above description to ensure mono compatibility of distance effect may also be generalised to the case of m-channel stereo systems where it is desired to ensure retention of the distance effect after a matrix reduction to mono or stereo with a smaller number m" of channels, by replacing the blocks 35 and 32*a* in FIG. 6 by energy-preserving matrix or panpot means having m-channel outputs, where said blocks may be trivial, and block 32*b* by an energy-preserving matrix means having an (m–m")-channel output, and where the reflection simulation means 1*a* and 1*b* are respectively m-channel and (m–m")-channel simulators having simulated reflection cues consistent with a desired distance and not overlapping one another, and where the gain means 39*a* and 39*b* are replaced by an m×(m–m") matrix means 39 (not shown) whose m-channel output signal 23*c* is such as to be nulled, i.e. made equal to zero, when passed through that matrix that reduces m-channel stereo to m"-channel stereo or mono. The means 1*a,* as before, is such that all simulated early reflections have either the same or left/right mirror-image positions to its input signals 22*a.*

Other Distance Cues

As with all devices producing psychoacoustic illusions, the more of the cues available with a desired illusion are made correct, the better and more reliable will be the resulting illusion. It is therefore preferable to provide distance simulation means according to the invention which also render cues other than early reflection gains and delay cues consistent with the intended distance.

Such additional distance cues, or those that aid interpretation of other distance cues, include:

(i) Equalisation of the direct sound, which will typically be of the form $e^{-rd/c}$ for a distance d, where r is in general frequency-dependent, plus an additional overall equalisation to compensate for the change in the ears subjective frequency response between a natural level of sound for a source at that distance and the actual reproduced level of sound, (ii) The angular size of the sound source. If a sound source has physical radiating area width w, then at distance d it will subtend an angular width $$2\tan^{-1}(1/2w/d) \tag{18}$$

and this can be simulated either by spreading a stereo recording of the source signal across this width, or by spreading different frequency components of a monophonic source to and fro across a narrow stereo stage having this angular width. For many sound sources, a typical radiating area width is around 1 foot (0.3 m), and an angular width based on this size may be a basis for providing an angular size distance cue, although a user adjustment of apparent size can be provided.

(iii) Relative level of reverberant decay sound to direct sound. While the importance of this cue has often been overstated, it is nevertheless generally desirable that the ratio of direct sound energy gain to the energy gain of the reverberant delay component of reverberation should be inversely proportional to the square of distance.

(iv) Reverberation time. While this is not normally thought of as a distance cue, it provides information that can either aid or confuse the interpretation of early reflection cues, since at each frequency, the −60 dB reverberation time $T_R$ is related to the absorption per unit time delay r via the equation:

$$T_R=(\log_e 1000)/r. \tag{19}$$

Thus it is possible for the ears to deduce the value of r from the reverberant decay of sounds and to use this in solving equation (1) and (4). It is therefore desirable that the reverberation time $T_R$ of any added reverberation should satisfy equation (19) (v) Absolute time delay. If a source is far away, it will arrive later at a listener than a close source, and it will not sound convincing if a supposedly distant musical line is in exact time-synchronism, or even preceeds, a supposedly close musical line. If such time delay is not incorporated into the source signal, it may be provided by delay means 3 as shown in FIGS. 1, 3, 5 and 6, whose delay should be equal to d/c, apart from any offset required for any time delay or advance in the source sound.

(vi) Proximity effect. From basic principles of physical acoustics, it is known that the n'th spherical harmonic components of a sound field have a bass boost at an ultimate rate of 6.02 n dB per octave starting at a frequency inversely proportional to d/c. For example, velocity or first order components have a 6.02 dB per octave bass boost with +3.01 dB point at a frequency $$c/(2\pi d). \tag{20}$$

It is possible to provide similar bass boosts in at least some of the reproduced velocity components of a stereo signal. For example, the difference signal L−R of a 2-channel stereo programme is reproduced as acoustical velocity, and so may be subjected to a bass boost corresponding to simulated source distance, especially for close sounds, although it must be noted that it is necessary to compensate, for example by a compensating bass cut of the difference signal, for the finite distance of the reproducing loudspeakers.

(vii) Döppler effect. If the simulated sound source distance is varied in real life, it will have associated pitch change due to the variation of the time delay to the listener. With moving sound, the distance effect will be more convincing if this so-called Döppler effect is simulated. This may be done by providing a continuously variable time-delay means 3 in the direct sound signal path 25.

(viii) Apparent loudness. Sound sources with a familiar natural sound will have a particular direct-sound level at each distance d, which is inversely proportional to d. Thus it will be more convincing, especially with moving sounds, if such loudness changes are simulated, e.g. by the direct-path gain means 5. Alternatively, a change in loudness can be simulated by equalising the source signal to have the perceived subjective tonal quality it would have at the natural loudness, taking into account the change in the ears subjective frequency response at different levels, such as are used in so-called "loudness" controls.

It is preferred, in implementations of the invention, that one or more of the above additional distance cues are provided, and that any variable distance adjustment control means used should also provide control of these additional cues in a manner such that several cues vary with distance in a mutually consistent fashion.

Blended Simulation Means

In above descriptions of the invention, the variations of the distance effect produced by simulated early reflection cues have been derived by a combination of gain and time delay changes prior to the simulation means. A more general form of the invention is now described by way of example, in which the early reflection simulation means has two or more signal paths for different signal components, the two or more paths having identical tap delays $t_i$ but different associated tap gains $G_i$ associated with different simulated distances, said paths being combined or blended at the output of said simulation means, wherein the simulated distance of a source signal S is varied by feeding said signal, possibly via a time delay means, to the two or more said signal paths with gain means in a manner such as to produce effective tap gains $G_i'$ for that source signal associated with a predetermined source distance which, in general will be different from those associated with the individual said signal paths.

Figure 8:
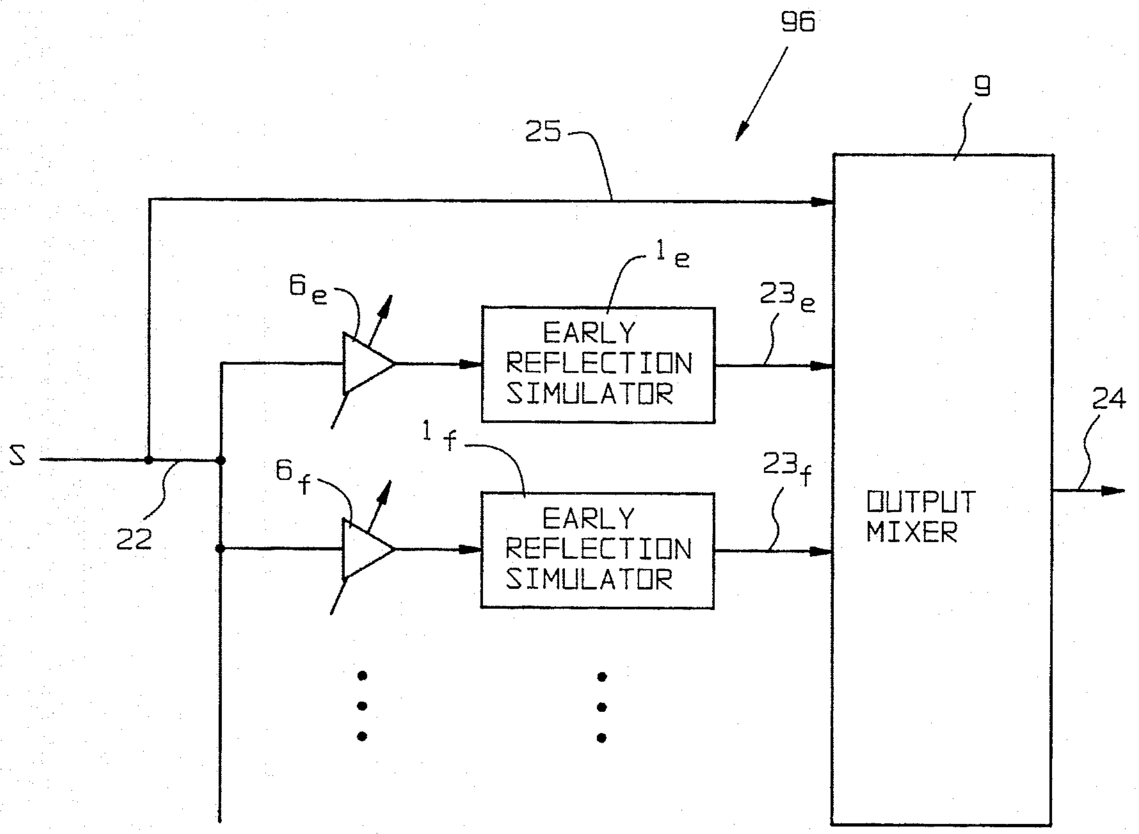
FIG. 8 shows an example of the invention blending the outputs of a plurality of early reflection simulation means.

A simple example of this more general form of the invention is illustrated in FIG. 8, in which a source signal S is fed via a direct signal path 25 to an output mixing means 9 and via an indirect signal path 22 and a plurality of gain adjustment means 6*e*, 6*f*, etc., to a said plurality of early reflection simulation means 1*e*, 1*f*, etc. having identical tap delays $t_i$ for the n taps i=1 to n but different gains $G_{ie}$, $G_{if}$, etc associated with said taps having different associated distances $d_e$,$d_f$ etc; the outputs 23*e*, 23*f* etc. of said simulation means 1*e*, 1*f* etc. are fed to said output mixing means 9 to provide output signals 24 having a predetermined simulated distance effect.

In the simplest case, $G_{ie}$ and $G_{if}$ are substantially given by the equations:

$$G_{ie}=[1/(1+ct_i/d_e)]e^{-rt_i} \tag{21e}$$

$$G_{if}=[1/(1+ct_i/d_f)]e^{-rt_i} \tag{21f}$$

and the gains of the means 6*e*, 6*f* are of the form $h_e$ and $$h_f=1-h_e \tag{22}$$

respectively, so that the effective i'th tap gain of the means shown in FIG. 8 is given by $$G_i' = h_eG_{ie}+(1-h_e)G_{if} \tag{23}$$

$$= [1/(1+ct_i/d_i')]\, e^{-rt_i}, \tag{24}$$

where the effective distance $d_i'$ associated with the i'th tap is no longer a constant. However, if for example $d_e=2d_f$, and $h_e=½$, then $d_i'$ varies from $1⅓d_f$ for small tap delays $t_i$ to $1½d_f$ for large tap delays $t_i$, so that in such cases, the variation of $d_i'$ is not very great, and may produce an adequate simulated distance of around 1.4 $d_f$. However, in the case that $d_e$ and $d_f$ have a much larger ratio, the effective distance associated with different taps will vary much more, from say ½$d_e$+½$d_f$ for small tap delays to $$2d_ed_f/(d_e+d_f) \quad (25)$$

for large tap delays when $h_e$=½.

However, the method of FIG. 8 can be made to give a much more accurate distance effect if a stereo output is used and if the stereo positions to which the outputs of the i'th taps are panned is chosen carefully to be different for the two simulation means 1*e* and 1*f*. We can define the direction to which a sound is panned within a 2-channel stereo signal to be that angle φ such that the sound has gains $$g_L=g\cos(45°-\phi) \quad (26L)$$

and $$g_R=g\cos(45°+\phi)=g\sin(45°-\phi) \quad (26R)$$

in the respective left and right channels. A rotation matrix $$\begin{pmatrix} \cos\theta_i & -\sin\theta_i \\ \sin\theta_i & \cos\theta_i \end{pmatrix} \quad (27)$$

acting on the left and right channels has the effect of changing the direction of a panned stereo sound from φ to φ−θ without changing the overall gain.

If the simulation means 1*e* and 1*f* in FIG. 8 have stereo outputs in which the outputs of the i'th tap have respective gains $G_{ie}$ and $G_{if}$ and stereo direction angles which differ by an angle $\theta_i$ (for example by using a rotation matrix (27) at the output of the i'th tap of one of said simulation means), and if each simulation means is fed with respective gains $h_e$ and $h_f$ in the same stereo position, then the resulting gain of the blended or combined i'th tap output is given by $$G_i'^2=h_e^2G_{ie}^2+h_f^2G_{if}^2+2\cos\theta_i\, h_eh_fG_{ie}G_{if} \quad (28)$$

By choosing $h_e$, $h_f$ and $\theta_i$ for each tap appropriately, it is possible via equation (28) to ensure that $G_i'$ conforms closely to the form $$G_i'=[1/(1+ct_i/d')]e^{-rt_i} \quad (29)$$

for a fixed distance d' when $G_{ie}$ and $G_{if}$ satisfies equations (21e) and (21f).

For example, choosing $h_e=h_f=2^{-1/2}$, $\theta_i$ is given by solving the mathematical equation $$\cos\theta_i=(1+ct_i/d_e)(1+ct_i/d_f)\times\left[\frac{1}{(1+ct_id')^2}-\frac{1/2}{(1+ct_i/d_e)^2}-\frac{1/2}{(1+ct_i/d_f)^2}\right]. \quad (30)$$

If equation (30) is satisfied for all taps, then a reasonable distance simulation is given for all $h_e$=cosφ' and $h_f$=sinφ' when the parameter φ' lies between 0° and 90°. When φ'=0°, the simulated distance is $d_e$, when φ'=45°, the simulated distance is d', and when φ'=90°, the simulated distance is $d_f$, with intermediate values of φ' giving a smoothly varying law for simulated distance. Thus using a sine/cosine gain means for means 6*e* and 6*f* in FIG. 8, when equation (30) for the angular difference $\theta_i$ of the i'th tap outputs holds, allows simulated distance to be adjusted. If one channel of a stereo signal is fed directly to means 1*e* and the other (panned to the same position) to means 1*f*, then different stereo positions panned by a sine/cosine panning means will similarly be given a different simulated distance across the stereo stage, for example allowing different respective distances $d_e$, d', and $d_f$ to be chosen for left, centre and right sound positions. As a sound is panned across the stereo stage, its simulated distance will vary accordingly.

This aspect of the invention may also be used even if the gains $G_{ie}$ and $G_{if}$ do not exactly satisfy equations (21e) and (21f), but fluctuate around their general trend. One can still use a choice of relative angle $\theta_i$ of delay tap outputs to give a third simulated distance for sounds panned between the two simulation means.

Moreover, this aspect of the invention may be combined with the use of additional gain and delay means in the direct and indirect signal paths, such as described in connection with FIGS. 1 to 3, 5 and 6 above, to provide further variations in simulated distance.

A further variation of the invention, which works if desired with monophonic as well as stereophonic early reflection simulation means, uses the method shown in FIG. 8 and as described above, except that instead of an angular difference $\theta_i$ of stereo position of the i'th tap outputs being provided, mono tap outputs, or stereo tap outputs in the same stereo positions, are provided, but where the i'th tap output from means 1*e* and from means 1*f* are passed through all-pass phase difference means producing a phase difference between the two outputs of $\theta_i$ before addition by output summing means 9. The effect of such a phase difference on the gain $G_i'$ of the blended simulated reflections is identical to that given in equation (28) for a stereo angular position difference $\theta_i$. Thus the choice of equation (30) in association with gain $h_e$=cos φ' and $h_f$=sin φ' of means 6*e* and 6*f* respectively can still be used to provide a variation of simulated distance.

Use of Natural Early Reflections

The invention may be used with natural early reflection simulation means, whereby the natural monophonic or stereophonic early reflections at a source distance d, measured by a microphone system having an omnidirectional energy response to reflections, in response to a monophonic source signal, are used to implement an early reflection simulation means. Such natural early reflections may be measured either in an actual room with actual microphones, or by means of a computer simulation of the early reflections picked up by a notional microphone in a computer modelled room.

While the use of such natural early reflection simulation means is not itself new, hitherto such a method has not provided good simulation of distance for a stereo source for all stereo positions P. For early reflections appropriate to a natural source at the centre of the stereo image, this may be done by providing a stereo-in stereo-out early reflection simulation means wherein the left and right channel simulated early reflections comprise the centre-mono-source natural early reflections rotated within the stereo stage respectively 45° to the left and 45° to the right, using rotation matrices such as previously described.

Other modifications of natural early reflection cues are possible to provide artificial control of simulated distance. For example, natural (or, as an alternative, artificial) early reflection cues for a source distance d may be modified to simulate another source distance d' without changing the time delays of simulated reflections by multiplying the impulse response of the early reflection simulation means by $$\frac{1+cT/d}{1+cT/d'} \quad (31)$$

after elapsed time T, where c is the speed of sound in air.

The use of such modified natural reflection cues has the advantages that : (i) computation of new coefficients for different simulated distances d' is simple, (ii) If one has chosen simulated reflection cues for one distance having a very low subjective colouration by trial and error, one can continuously vary simulated distance while minimising the risk of severe colouration, and (iii) The means described above of using blended outputs of early reflection simulation means having identical tap delays to provide simple gain adjustments of simulated distance may be used with two or more early reflection simulators comprising the same natural early reflections modified as in equation (31) for different distances d', and with matrix or phase rotations $\theta_i$ according, for example, to equation (30) after elapsed time $t_i$.

Broad Aspects

While above descriptions of the invention have many detailed implemantations, the following aspects of the invention are common to many implementations.

According to the invention in a broad aspect, there is provided audio signal processing means responsive to one or more input signals and providing one or more output signals producing a simulated distance effect, said signal processing means comprising means responsive to said input signal for feeding source signals along a direct signal path and along an indirect signal path, said indirect signal path passing through early reflection simulation means wherein each simulated reflection has an energy gain characteristic of the time delay of said simulated reflection and of a predetermined sound source distance associated with said simulation means, the outputs of said direct signal path and said indirect signal path being fed to an output mixing means providing said output signals, where first gain means and first time delay means are provided affecting signals passing through said direct signal path, and second gain means and second time delay means associated with each input source signal and in the path of each of said early reflection simulation means are provided affecting signals passing through said indirect signal path, wherein one or more of said gain means and said time delay means may be trivial, where a gain is trivial if it equals one and a time delay is trivial if it equals zero, but where at least two of said means are not trivial and are provided with adjustments responsive to a distance control means so as to allow variation of said simulated distance, whereby for said provided adjustments of said time delay means and said gain means, the gain g of simulated early reflections responsive to an input source signal S in said output signals having a time delay T relative to the first arrival time of said source signal in said output signals, which said first arrival shall be via said direct signal path, said gain g being measured relative to the gain of said first arrival in said output signals, substantially follows the general trend of the formula $$g=[1/(1+cT/d_S)]e^{-rT} \quad (32)$$

where c is the speed of sound in air, r is a predetermined constant of absorption per unit time which may be dependent on frequency, and $d_S$ is a simulated distance for the source signal S responsive to said distance control means.

In preferred implementations of the invention, said early reflection simulation means remain unchanged in response to adjustments of said distance control means controlling said simulated distance $d_S$ of input source signal S.

In some preferred implementations of the invention, said distance control means and said gain means may be provided by the position, and hence relative gains within the stereo channels, of sound source signals positioned within a stereo input signal.

In another aspect of the invention, distance simulation is provided for a stereophonic input signal, whereby each source position P within the stereo stage of said signal is provided with a simulated distance $d_P$ such that, for each said source position P, the gain g of simulated early reflections having a time delay T at the output relative to the time of the first arrival at said output, said gain g being measured relative to the gain of said first arrival in said output, substantially follows the general trend of the formula $$g=[1/(1+cT/d_P)]e^{-rT}, \quad (33)$$

where c is the speed of sound in air and r is a predetermined constant of absorption per unit time which may be dependent on frequency.

In general, the degree of deviation of said relative gains g of simulated early reflections from the general trend of said formulae (32) or (33) should be no greater than that encountered with early reflections in those natural room acoustics found to have a good subjective sense of distance perception.

In actual rooms, the effect of room boundary absorption and of non-omnidirectionality of sources will be to cause the individual gains g of reflections with relative time delay T to vary from the formulas (32) or (33) by a few dB within the first 50 ms, with the gain fluctuating (on a logarithmic or dB scale) to either side of the trend of equ. (32) or (33) for a suitably chosen absorption constant r per unit time. Also in actual rooms, a small proportion of early reflections will overlap in time, causing such overlapping reflections to have a gain increase typically of 6 dB relative to the general trend.

Besides such deviations of gains g from the general trend of formulae (32) or (33) encountered in actual rooms that convey a good distance effect, it is not necessary that the polarity or phase of simulated early reflections be identical to that of the direct sound signal, only that the magnitude of the gain should follow the general trend of equs. (32) or (33). Wherever a relative amplitude gain is referred to or implied in this description, other gains of possibly different phase or polarity may be substituted provided that they have the same magnitude. In the stereophonic case of gains implemented by equs. (15) or (16), polarity inversion of the gain is equivalent to increasing the rotation angle $\theta_i$ by 180°, and even in the monophonic case, a phase change or polarity inversion is equivalent to using a gain with a 1×1 orthogonal or unitary matrix.

While for greatest naturalism of effect, such polarity or phase changes may be preferably minimised, they are nevertheless permitted within the invention. Moreover, such phase changes may be frequency dependent and take the form of an all-pass time dispersion network, provided only that the degree of time dispersion is not so large that the ears and brain cease to recognise the dispersed simulated reflection as a simulated reflection. It is thought that a time dispersion of under 2 ms is likely to substantially preserve the psychoacoustic integrity of a simulated reflection, and as noted earlier, any energy preserving linear signal processing means (including all-pass time dispersion networks) not introducing psychoacoustically significant time delay or attenuation of transients may be used without altering the simulated distance.

The prior art, as has been noted earlier, discloses the simulation of the early reflection gains and time delays of actual sources in actual or computer simulated rooms, and it has further been noted in the prior art (see G. S. Kendall & W. L. Martens "Simulating the Cues of Spatial Hearing in Natural Environments", Proceedings of the International Computer Music Conference, Paris, 1984, pages 111–125) that the first 33 ms of a room acoustics (which is a part of the early reflection portion of the room response) appears to be responsible for the sense of distance of a sound source.

However, the present invention includes several novel features as compared to this prior art case. Firstly, the prior art was not able to simulate the effect of distance according to the general trends of equs. (32) or (33) for sounds originating in arbitrary positions in a panned or premixed stereo stage, since if different natural room early reflection simulation was used separately for the left and right positions in a stereo stage, then the general trends of equs. (32) or (33) were not followed for sounds panned to intermediate positions in a stereo stage. This was because independent simulated reflection gains and time delays were generated for the left and the right channel signal components of the stereo signal, rather than a single gain and time delay for the composite stereo signal.

A second novel feature is that the present invention allows the distance effect to be varied in response to control means or in response to sound source direction not by simulating the early reflections at a new room position, but rather by gain and time delay alterations in the direct and indirect signal paths having the effect of altering $d_P$ or $d_S$ in equs. (32) or (33). It will be noted, in particular, that numerous of the different distance simulation algorithms described are such that the difference between the time delays of any two simulated early reflections is unchanged as the simulated distance is varied, whereas in actual or natural room acoustics, the difference between the time delays of any two early reflections in general varies as the sound source distance varies.

Stereo aspects of the invention are applicable to stereo in its broadest sense, i.e. to signals in a plurality of channels encoded for directional reproduction. This not only includes the cases of channels intended to feed loudspeakers, such as two- arid three-speaker frontal stage stereo or the so-called 3:2 system using 3 frontal speakers and two rear speakers used in the cinema and HDTV for surround sound, but also directional sound encoding systems in which a sound is encoded in a predetermined direction or position P by being incorporated into the plurality n of audio channels with n predetermined gains (which may be real or complex) associated with the direction or position P.

An example of such a directional encoding system is ambisonic B-format, where sounds positioned at an azimuth angle Q (measured anticlockwise from the due-front direction in the horizontal plane) are encoded into three channels W, X and Y with respective gains 1, $2^{1/2}$ cos θ and 2½ sin θ. Such B-format signals are typically reproduced via ambisonic decoders intended to give a subjective recreation via a loudspeaker layout of the encoded directional effect, such as are described in the inventors British patents 1494751, 1494752, 1550627 and 2073556 and U.S. Pat. Nos. 3,997,725, 4,081,606, 4,086,433 and 4,414,430.

Although not essential according to the invention, it is preferred that the simulated early reflections should be located in directions different from that of the direct sound source and that the quality of localisation of the simulated reflections should be good. One way of ensuring this for B-format signals is to ensure that for each direct-sound source azimuth θ, each early reflection is encoded at another azimuth. The simplest way of doing this is to use a three-channel tapped delay line (with identical tap delays $t_i$) in all three channels, conveying the W, X and Y B-format signals, and to subject the i'th tap output to a matrix gain $$\begin{pmatrix} G_i & 0 & 0 \\ 0 & G_i\cos\theta_i & \mp G_i\sin\theta_i \\ 0 & G_i\sin\theta_i & \pm G_i\cos\theta_i \end{pmatrix} \quad (34)$$

having the effect of giving the B-format signal a gain $G_i$ and a rotation $\theta_i$ in direction (in the case of the upper choice of signs in equ. (34)), where the rotation angle $\theta_i$ may be different for each simulated reflection. If $G_i$ follows the general trend of equ. (14), this will produce a simulated distance d for every source in the B-format encoded signal W, X and Y.

As in the two-channel stereo case described earlier, it is also possible to give differently-positioned sounds in the B-format signals W, X and Y different simulated distances. This may be achieved using what is termed a forward dominance transformation matrix. From the above definition of B-format encoding gains, it will be noted that for a single sound direction, $$2W^2=X^2+Y^2, \quad (35)$$

and moreover that, whenever (35) is satisfied, the three signals W, X, and Y are encoded according to B-format for some azimuth direction θ.

The forward dominance transformation $$W'=\tfrac{1}{2}(g_F+g_B)W+8^{-1/2}(g_F-g_B)X \quad X'=\tfrac{1}{2}(g_F+g_B)X+2^{-1/2}(g_F-g_B)W \quad Y'=(g_Fg_B)^{1/2}Y \quad (36)$$

of B-format signals, for arbitrary real gains $g_F$, $g_B$ whose product is non-negative, is such that if equ. (35) holds for the signals W, X, Y, then it also holds when they are replaced by the signals W', X', Y', so that the latter are also B-format signals, albeit ones with different gains and azimuths for the encoded sounds. In particular, sounds encoded into W, X, Y with azimuth 0 are also encoded into W', X' and Y' at azimuth 0 but with gain $g_F$, and sounds encoded into W, X, Y at azimuth θ=180° are also encoded at azimuth 180° in W', X' and Y' but with gain $g_B$. Sounds encoded into W, X, Y at azimuth ±90° are encoded into W', X' and Y' at azimuth $\pm\arccos[(g_F-g_B)/(g_F+g_B)]$ with gain $\tfrac{1}{2}(g_F+g_B)$.

Thus if a B-Format signal W, Y, Y is passed through a 3-channel delay line with taps at identical delays $t_i$ in all 3 channels to form a B-format early reflection simulator, then the matrix 13$_i$ for the i'th tap of the early reflection simulator shown in FIG. 4 may be of the matrix form $$\begin{pmatrix} 1 & 0 & 0 \\ 0 & \cos\theta_i & \mp\sin\theta_i \\ 0 & \sin\theta_i & \pm\cos\theta_i \end{pmatrix} \begin{pmatrix} 1/2(g_F+g_B) & 8^{-1/2}(g_F-g_B) & 0 \\ 2^{-1/2}(g_F-g_B) & 1/2(g_F+g_B) & 0 \\ 0 & 0 & (g_Fg_B)^{1/2} \end{pmatrix} \quad (37)$$

where $\theta_i$ is a rotation angle for each tap number i, and where $g_F$ and $g_B$ are gains dependent on the tap delay $t_i$ substantially following the trend of the two formulas $$g_F=\pm(e^{-rt^i})/(1+ct_i/d_F) \quad (38a)$$

and $$g_B=\pm(e^{-rt^i})/(1+ct_i/d_B), \tag{38b}$$

where $d_F$ and $d_B$ are simulated distances for respective front and back sound directions. Provided that the ratio of the distances $d_F$ to $d_B$ is not too large (e.g. between one half and two), then for intermediate encoded sound directions Q in the B-format sound stage, the early reflection simulator with matrix tap gains (37) will give effective tap gains corresponding to intermediate distances, following a gain law $$g_F{}^{1/2}(1+\cos\theta)+g_B\tfrac{1}{2}(1-\cos\theta). \tag{39}$$

While equ. (39) is not exactly of the form $$\pm(e^{-rt^i})/(1+ct_i/d) \tag{40}$$

for an intermediate distance d depending on θ, it can be a reasonable approximation to such a law.

One way of making the approximation to a simulated distance for all azimuths as good as possible is to choose the gains $g_F$ and $g_B$ for each tap delay $t_i$ to correspond to particular simulated distances $d_+$ and $d_-$ at respective azimuths $\theta_+$ and $\theta_-$ which may be 45° and 135° respectively, giving $$\tfrac{1}{2}[g_F(1+\cos\theta_+)+g_B(1-\cos\theta_+)]=\pm(e^{-rt^i})/(1+ct_i/d_+) \tag{41}$$

and $$\tfrac{1}{2}[g_F(1+\cos\theta_-)+g_B(1-\cos\theta_-)]=\pm(e^{rt^i})/(1+ct_i/d_-). \tag{42}$$

Then the distance simulation will be best at azimuths $\pm\theta_+$ and $\pm\theta_-$, but will also be reasonable at other azimuths, especially in the case $\theta_+=45°$ and $\theta_-=135°$.

The encoded azimuths at which the simulated distance is maximum and minimum can be rotated from 0° and 180° by preceeding the gain matrix $\mathbf{13}_i$ of equ. (37) by an initial rotation matrix. The methods above can be generalised to other directional encoding systems, such as full-sphere B-format signals W, X, Y, Z by using three-dimensional rotation matrices, and to other encoding systems in which linear transformations analogous to rotations and forward dominance transformations can be found.

Simplified Stereo Implementation

The two-channel stereo case where the simulated distance at left and right positions differs from the simulated distance at the centre position is capable of an especially convenient implementation. Using the notations used earlier for the two-channel stereo case, it can be shown that equ. (30) has a real solution whenever d' lies between $2^{-1/2}|d_e-d_f|$ and $2^{-1/2}(d_e+d_f)$. In particular, in the case where the desired distance of the two edges of the stereo stage is $d_E=d_e=d_f$, i.e. the same distance $d_E$ at both edges, then the distance $d_C=d'$ of the centre of the stereo stage may satisfy $$0\leqq d_C\leqq 2^{1/2}d_E. \tag{43}$$

There is a way of simulating one distance $d_C$ at the centre of the stereo stage and another distance $d_E$ at the edges of the stereo stage using separate early reflection simulators operating on the respective sum and difference signals of the input source stereo signal L and R.

Define an MS matrix as being a matrix means that takes two signals L and R and converts them into $$M=2^{-1/2}(L+R)\quad D=2^{-1/2}(L-R). \tag{44}$$

Then the inverse matrix is also an MS matrix, since $$L=2^{-1/2}(M+D)\quad R=2^{-1/2}(M-D). \tag{45}$$

So-called MS signal processing techniques for stereo signals are familiar in the prior art, whereby stereo signals may be converted using MS matrices between the standard left/right form and the MS form of equ. (44), and linear signal processing of a stereo signal may be performed in whichever of the two forms is most convenient. In particular, stereo width control is often most conveniently performed on signals in MS form by means of giving the signals M and D different gains, as first noted in A. D. Blumlein's British patent 394325.

Figure 9:
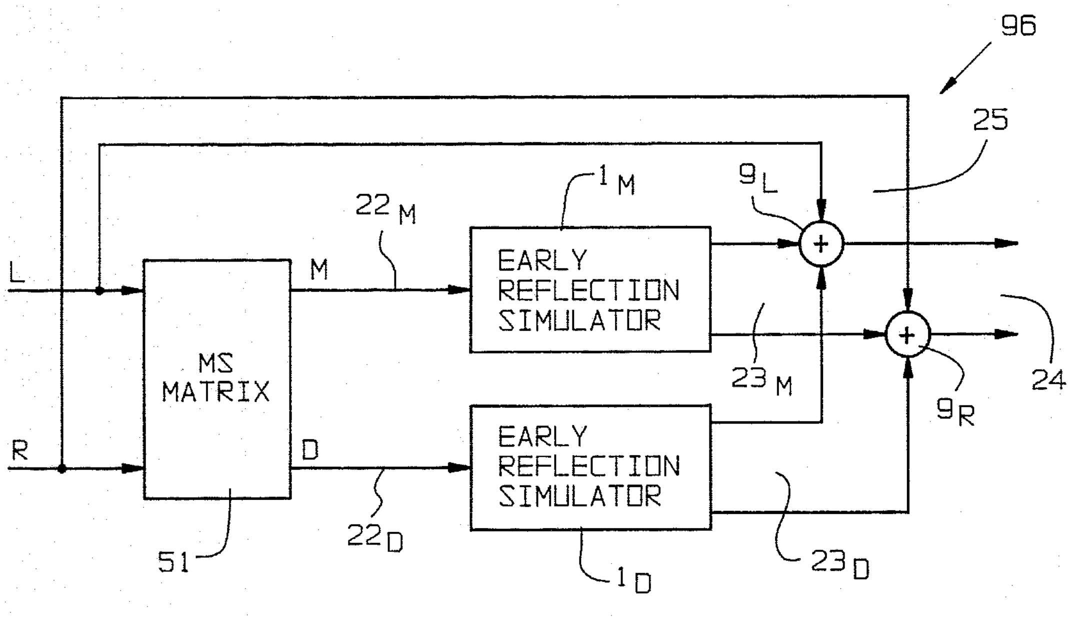
FIG. 9 shows a stereophonic example of the invention using sum and difference signal processing techniques.

FIG. 9 shows a stereo example of the invention capable of simulating different distances $d_C$ and $d_E$ at the respective centre and edges of the stereo stage using MS signal processing. Input left and right stereo signals L and R are converted by input MS matrix means 51 into signals M and D (respectively termed "sum" and "difference" signals) according to equs. (44), and each is fed to a respective early reflection simulator $\mathbf{1}_M$ and $\mathbf{1}_D$ with respective mono inputs $\mathbf{22}_M$ and $\mathbf{22}_D$ and respective stereo outputs $\mathbf{23}_M$ and $\mathbf{23}_D$, shown in this case as being in left/right form but which may alternatively be in MS form, which are then added via stereo output mixing means $\mathbf{9}_L,\mathbf{9}_R$ to each other and to a direct signal path 25 from the input to form an output stereo signal 24.

The sum signal path early reflection simulator $\mathbf{1}_M$ may be any mono-in stereo-out early reflection simulator producing early reflection cues consistent with a simulated distance $d_C$, for example a stereo simulation of the response of an actual or computer-simulated room with a good sense of distance perception to an actual or simulated sound source position, or else a tapped delay line simulator where the tap with relative delay T has gain magnitude following the general trend $$g_C=(e^{-rT})/(1+cT/d_C). \tag{46}$$

The difference signal early reflection simulator $\mathbf{1}_D$ is related to the sum early reflection simulator $\mathbf{1}_M$ by having simulated early reflections having exactly the same time delays as the sum-path early reflection simulator $\mathbf{1}_M$, but associated gains $g_D$ such as to produce a simulated distance $d_E$ at the edges of the input stereo stage. This may be achieved by making the difference simulator $\mathbf{1}_D$ equal to the sum simulator $\mathbf{1}_M$ except that: (i) the left and right outputs are replaced by the right and minus the left outputs (i.e. the outputs are interchanged and one of them given a polarity reversal) to account for the fact that a difference signal path is being processed, and (ii) the gains of the taps of the sum simulator $\mathbf{1}_M$ are also multiplied by a factor $$h_D=\pm\left\{2\left(\frac{1+cT/d_C}{1+cT/d_E}\right)^2-1\right\}^{1/2}, \tag{47}$$

in order to form the gains of the difference-path simulator $\mathbf{1}_D$. Equ. (47) ensures that the simulated distance at the edges of the stereo input stage are $d_E$ according to equ. (30).

Figure 10:
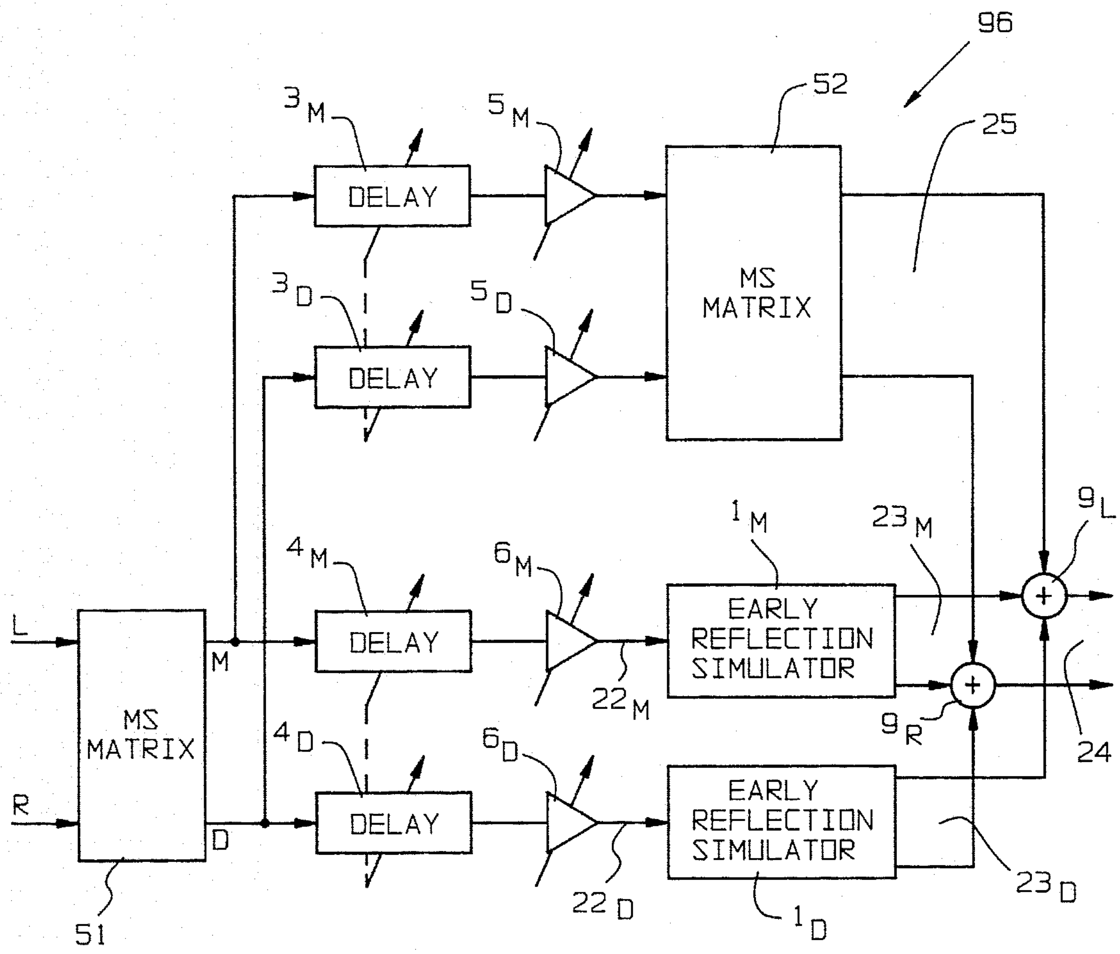
FIG. 10 shows a stereophonic example of the invention using sum and difference techniques and time delay and gain adjustments in the direct and indirect signal paths.

Various aspects of the invention may be applied to an MS stereo implementation of the invention such as that shown in FIG. 9. By way of example, FIG. 10 shows a version of FIG. 9 in which delay and gain adjustments of the simulated distance effect in different parts of the stereo stage are provided by means of gains $\mathbf{5}_M$, $\mathbf{5}_D$, $\mathbf{6}_M$ $\mathbf{6}_D$ and delays $\mathbf{3}_M$, $\mathbf{3}_D$, $\mathbf{4}_M$, $\mathbf{4}_D$ in the direct 25 and indirect 22 signal paths. For convenience and simplicity of description in FIG. 10, signal processing in the direct signal path 25 is shown in MS form, but equivalent left/right signal processing may alternatively be used.

In FIG. 10, the delays $\mathbf{3}_M$ and $\mathbf{4}_M$ and gains $\mathbf{5}_M$ and $\mathbf{6}_M$ affecting the input sum signal M may be adjusted to alter the simulated distance of centre-stage sounds from its intial simulated value $d_C$ as described earlier, for example by ensuring that the direct path delay $\mathbf{3}_M$ minus the indirect path delay $\mathbf{4}_M$ equals δ/c and the direct path gain $\mathbf{5}_M$ divided by the indirect path gain $\mathbf{6}_M$ equals $(e^{-r\delta/c})d_C/(d_C+\delta)$, where the simulated centre-stage distance is changed from $d_C$ to $d_C+\delta$.

In order that the modified distance simulation means of FIG. 10 should continue to work for all positions in the stereo stage, it is necessary that the delay $\mathbf{3}_D$ in the direct difference signal path should have the same delay as the delay $\mathbf{3}_M$ in the direct sum signal path, and that the delay $\mathbf{4}_D$ in the indirect difference signal path $\mathbf{22}_D$ should have the same delay as the delay $\mathbf{4}_M$ in the indirect sum signal path $\mathbf{22}_M$. The gains $\mathbf{5}_D$ and $\mathbf{6}_D$ in the respective direct and indirect difference signal paths do not affect the simulated distance of centre-stage sounds, since these give a zero difference signal D, but they may be adjusted to modify the simulated distance $d_E$ of edge of stage stereo sounds.

The effect of using gains $\mathbf{5}_M$ and $\mathbf{5}_D$ in the sum and difference direct signal paths is to subject the direct signal to both gain and stereo width adjustment, and the effect of using the gains $\mathbf{6}_M$ and $\mathbf{6}_D$ in the indirect sum and difference signal paths $\mathbf{22}_M$ and $\mathbf{22}_D$ is to alter the stereo gain and width with which the input signals are fed to the stereo early reflection simulation algorithm.

If the direct-sound stereo width is to remain unchanged, then the gains $\mathbf{5}_M$ and $\mathbf{5}_D$ must be identical. However, unless $d_E=d_C$, there is in this case no value of the gain $\mathbf{6}_D$ that exactly gives early reflection simulator gains and delays for edge-of-stage images consistent with the distance $d_E+\delta$, although reasonable values of the gain $\mathbf{6}_D$ approximating this distance effect can be found.

However, if the direct path delay $\mathbf{3}_M$ and $\mathbf{3}_D$ minus the indirect path delay $\mathbf{4}_M$ and $\mathbf{4}_D$ equals δ/c, then it can be shown that the simulated distance of centre sounds can be made equal to $d_C+\delta$ and of edge-of stage sounds equal to $d_E+\delta$ by making the indirect path gains $\mathbf{6}_M$ and $\mathbf{6}_D$ both equal to the sum direct path gain $\mathbf{5}_M$ multiplied by $$(e^{r\delta/c})[1+\delta/d_C] \tag{48}$$

and by making the difference direct signal path gain $\mathbf{5}_D$ equal to $$\pm\{2[(1+\delta/d_C)/(1+\delta/d_E)]^2-1\}^{1/2} \tag{49}$$

times the sum direct signal path gain $\mathbf{5}_M$. This also has the effect of multiplying the stereo width of the direct sound stage by the factor (49). As in earlier examples, the value of the delay difference δ/c must be such that the first arrival at the output 24 is via the direct path.

Other Aspects

Numerous variations and combinations of above aspects of the invention will be evident to one skilled in the art. For example, the order of delay and gain means may be interchanged with other linear processing, gains or phase inversions may be added at different points in the signal processing signal path in a manner such that the overall function of the invention is unchanged, in a manner evident to those skilled in the art.

Summing or mixing means, and in particular the output mixing means 9, may be implemented not just by electrical analogue or digital signal processing means, but also by other means, and in particular acoustical means by reproducing the direct signal path signals and the indirect path signals through different loudspeakers. The output mixing means may also be implemented partly by electrical or digital means and partly by acoustical means, for example in the case where simulated reflections are reproduced via several loudspeakers only some of which reproduce signals from the direct path 25.

Similarly, gain and delay means may, if convenient, be implemented by acoustical means such as the time delay and gain attenuation of sound travelling a distance in air.

Applications

The invention may be applied to simulating a distance effect in monophonic or stereophonic sound reproduction systems, by providing simulated early reflections either via the main reproduction loudspeakers or via additional loudspeakers often known as "surround" loudspeakers. In the stereophonic case, the distance of different parts of the sound stage may be varied with, for example, the centre of the sound stage being placed at a different distance to the edges. By use of rotation matrices in association with individual delay line taps, the invention provides appropriate distance cues for all positions in the stereo stage, and not just for one or two positions as in the prior art in this application.

The invention may also be applied to sound recording applications, where recordings using a distant microphone may be supplemented by the use of close 'spot' microphones for soloists or individual instruments, whereby simulated early reflections are added to the close microphone signal to match the distance of the distant microphone, preferably using a value of the constant r matched to reverberation time $T_R$ according to equation (19).

The invention may also be used in live sound reinforcement in very dry or absorbant acoustics with very low level early reflections, where an acoustic sound, or an amplified direct sound, may be supplemented by reproduced simulated early reflections associated with a desired apparent distance.

The invention may also be applied to sound mixing applications, wherein a sound mixing means, such as a mixing console, may be provided with stereophonic positioning means (which are termed "panpots" whether or not they use potentiometer means of implementation) and with distance positionioning control means for each source signal to be mixed. Such distance positioning control means, which are most conveniently placed in the channel "strip" of a mixer associated with a given source signal, may be calibrated in, say, feet (i.e. in units of 0.3 meters) or meters.

Figure 11:
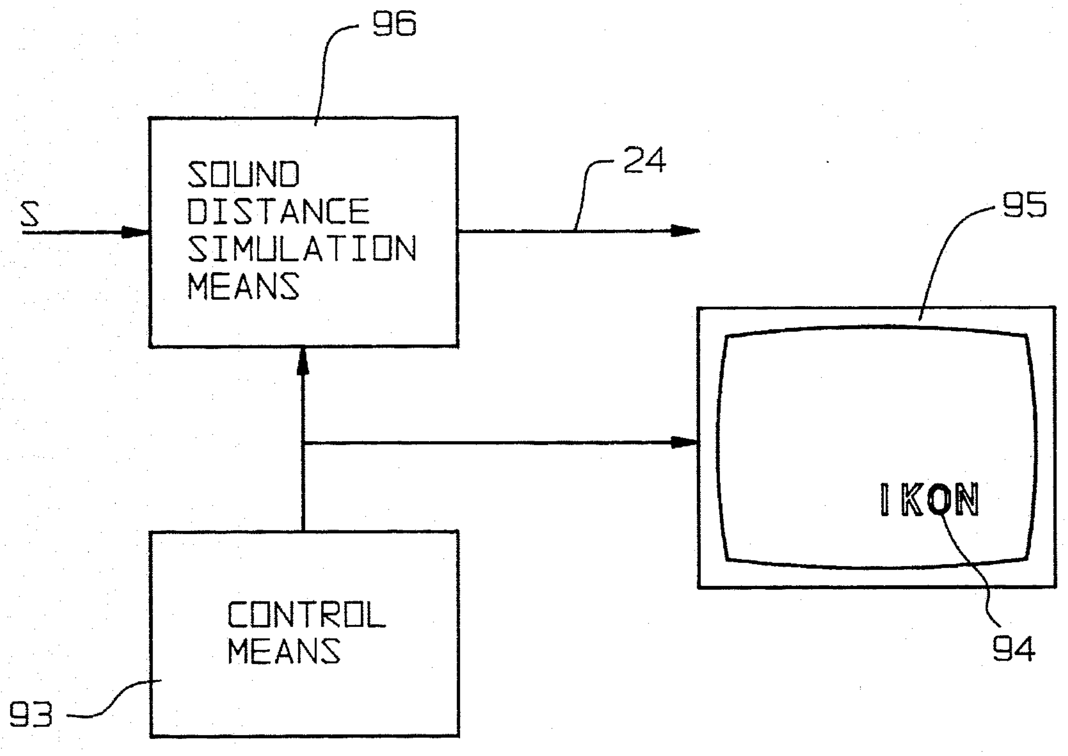
FIG. 11 shows control means for the simulated distance of a sound distance simulation means which also controls the apparent distance of an ikon.

Alternatively, refering to FIG. 11, distance positioning control means 93 may be used to adjust the simulated distance d of a sound source signal S by a sound distance simulation means 96 to provide an output sound signal 24 conveying a simulated sound distance effect with simulated distance d, and said control means 93 may also produce an ikon 94 on a visual display means 95 that varies in apparent visual distance according to the setting of the control means. Such an ikon display 94 superimposed on an associated visual image is particularly convenient in audiovisual productions where the apparent sound distance must be matched to the apparent distance of a visual image.

It will be appreciated that the invention broadly consists of modifying the relative magnitudes $g_S$ and time delays T of simulated early reflections so as to preserve or modify the simulated distance $d_S$ produced thereby for a sound source signal S at the input, whether or not the ideal relationship $$g_S=(e^{-rT})/(1+cT/d_S) \quad (50)$$

is satisfied exactly. In broad terms, the invention may be thought of as producing modified gain magnitudes $g_S'$ and modified time delays T' of simulated early reflections so as to produce a possibly modified simulated distance $d_S'$ for the sound source signal S such that substantially $$g_S'/g_S=(e^{-r}(T'-T))(1+cT/d_S)/(1+cT'/d_{S'}). \quad (51)$$

The relationship (51) is precisely that which would arise were equ. (50) to hold exactly, but may be applied even in cases where it does not. In practice, deviations from equation (51) of up to around 1 dB are found to have little harmful effect on the simulated distance effect, and deviations of 2 dB are generally acceptable and of 3 dB are still found to be quite acceptable.

In the invention, gain means, such as the gain means 5 and 6 in FIGS. 1 to 3 and similar gain means indicated by the same numerals followed by a letter in other figures may in general be matrix means having the effect of modifying the gains of sounds in different directions passing through them by differing amounts dependent on direction, and may also be frequency dependent. It is not in general required of gain means that they preserve sound source direction or that they alter the gain of all sound source signals or directions equally.

It is further allowed within the invention also to modify the absorption constant r to a new value r', which may also be frequency dependent, and in this case, equ. (51) is replaced by $$g_S'/g_S=(e^{-r'T'+rT})(+1+cT/d_S)/(1+cT'/d_{S'}). \quad (52)$$

In order for the invention to work well in producing a simulated distance, it is found desirable to simulate at least three simulated early reflections, and it is preferred to simulate at least four simulated early reflections, and broadly speaking it is even more preferred to simulate a number of five or more simulated early reflections.

In versions of the invention that are stereophonic (in the broad sense of handling a plurality of signals encoded for directional reproduction), the invention allows for the simulation of a distance effect even for sound source signals encoded into non-channel positions, i.e. into positions not reproduced from just a single one of the plurality of channels. In the case of ordinary 2-speaker stereo, this allows distance simulation for sound sources not encoded to be reproduced just from the left or right channels only, such as sounds panned to a position between the two loudspeakers.

I claim:

1. An audio signal processing system for processing a plurality of channels conducting signals encoded for directional reproduction comprising:

input means for receiving input signals;

output mixing means for producing an output signal;

early reflection simulation means;

a first signal path connecting said input means to said output mixing means; and a second signal path connecting said input means to an input of said early reflection simulation means and connecting an output of said early reflection simulation means to said output mixing means;

said early reflection simulation means producing, for each of the input signals S from said input means, including an input signal S encoded for reproduction from a non-channel direction, a multiplicity of delayed replicas of said input signal each having a time delay T relative to an arrival time via said first signal path of said input signal S to said output miming means, and having a gain magnitude $g_S$ relative to gain of a component corresponding to a first arrival of said input signal S at said output mixing means, said early reflection simulation means and said second signal path having in combination a gain/delay characteristic varying with a parameter $d_S$ corresponding to a simulated sound source distance, said gain/delay characteristic characterized by the following equation:

$$g=[1/(1+cT/d_S)]e^{-rT},$$

where c is the speed of sound in air, and r is a predetermined constant of absorption per unit time delay which is one of frequency dependent and frequency independent.

2. Audio signal processing system according to claim 1, wherein said gain magnitude $g_S$ is provided by matrix means.

3. Audio signal processing system according to claim 1, further including matrix means for forming gain magnitude $g_S$ proportional to an energy preserving matrix means, which is orthogonal of the first m" columns of an m×m orthogonal matrix means.

4. Audio signal processing system according to claim 1, wherein each of the input signals is provided with a different simulated sound source distance while sharing the early reflection simulation means in the second signal path.

5. Audio signal processing system according to claim 1, in which the deviation of said gain magnitude $g_S$ from said formula is not greater than 3 dB except when isolated said delayed replicas of said input signal overlap in time cause a greater deviation than 3 dB.

6. Audio signal processing system according to claim 1, wherein said output mixing means producing a plurality of output signals for directional reproduction, a number of said output signals linearly combined wherein one or more linear combinations of said number of the output signals for other forms of sound reproduction are such that relative gains $g_s'$ in said linear combination signals of simulated early reflections with relative time delay T are either substantially zero or have magnitudes substantially equal to $g_S'$ thereby providing also a simulated distance $d_S$ via other forms of sound reproduction.

7. Audio signal processing system according to claim 6 in which said output signals are provided for stereophonic reproduction via two or more loudspeakers and where said linear combination signals are provided for monophonic or stereophonic reproduction to a fewer number of loudspeakers than provided for the output signals not linearly combined.

8. Audio signal processing system according to claim 1, in which said early reflection simulation means is additionally provided with energy-preserving linear signal processing means not introducing psychoacoustically significant time delay or attenuation of transients discernable to the human ear.

9. The system of claim 1, wherein said input signal S encoded for reproduction from a non-channel direction corresponds to a direction of the input signal other than a speaker feed direction.

10. Audio signal processing system according to claim 1, further including matrix means for forming gain magnitude $g_S$ proportional to an energy preserving matrix means, which is unitary of the first m" columns of an m×m unitary matrix means.

11. Audio signal processing system including signal processing means responsive to an input signal that is from a control means; means for modifying a sound source signal S from a sound source so as to simulate said sound source at a perceived distance $d_S$; and visual display means arranged to display an image or icon, the apparent distance of said image or icon also being responsive to said control means and varying depending on said distance $d_S$, whereby the perceived distance of the sound source and the apparent distance of said image or icon correspond;

said signal processing means comprising:

input means for receiving the input signal;

output mixing means for producing an output signal;

early reflection simulation means;

a first signal path connecting said input means to said output mixing means;

a second signal path connecting said input means to an input of said early reflection simulation means and connecting an output of said early reflection simulation means to said output mixing means; and signal modifying means provided in one of said first and second signal paths and arranged to modify one of gain magnitude and time delay of a signal in said signal path;

said early reflection simulation means producing, for each input signal S from said input means, a multiplicity of delayed replicas of said input signal each having a time delay T relative to an arrival time via said first signal path of said input signal S at said output mixing means, and having a gain magnitude $g_S$ relative to a gain via said first signal path of said input signal S at said output mixing means; and said signal modifying means producing modified gain magnitudes $g_S'$ and time delays T' to produce a simulated distance $d_S'$, said early reflection simulation means and said signal modifying means having in combination a gain/delay characteristic varying with a parameter $d_S$ corresponding to the simulated sound source distance, said gain/delay characteristic characterized by the following equation:

$$g_S'/g_S=(e^{-r'r'+gt})(1+cT/d_S)/(1+cT'/d_S')$$

where c is the speed of sound in air and r and r' are a predetermined respective original and final constants of absorption per unit time delay and both the original and final constants are one of frequency dependent and frequency independent.

12. Audio signal processing system according to claim 11, wherein said output mixing means producing a plurality of output signals for directional reproduction, a number of said output signals linearly combined wherein one or more linear combinations of the number of said output signals for other forms of sound reproduction are such that the relative gains $g_S'$ in said linear combination signals of simulated early reflections with relative time delay T are either substantially zero or have magnitudes substantially equal to $g_S'$, thereby providing also the simulated distance $d_S$ via said other forms of sound reproduction.

13. An audio signal processing system for processing input signals and outputting an audio output signal giving a simulated distance effect comprising:

input means for receiving the input signals;

output mixing means for producing the output signal;

early reflection simulation a first signal path connecting said input means to said output mixing means;

a second signal path connecting said input means to an input of said early reflection simulation means and connecting an output of said early reflection simulation means to said output mixing means; and signal modifying means provided in one of said first and second signal paths and arranged to modify one of gain magnitude and time delay of signals in said signal path, thereby modifying a simulated distance parameter $d_S$;

said early reflection simulation means producing, for each of a plurality of the input signals S from said input means, including an input signal S encoded for reproduction from a non-channel direction, a multiplicity of delayed replicas of said input signal each having a time delay T relative to the arrival time of a component of the input signal corresponding to a first arrival of said input signal at said output mixing means, having a gain magnitude $g_S$ relative to gain of said component corresponding to a first arrival of said input signal at said output mixing means, said early reflection simulation means having a gain/delay characteristic varying with said parameter $d_S$ corresponding to a simulated sound source distance, said gain/delay characteristic characterized by the following equation:

$$g_s=[1/(1+cT/d_S)]e^{-rT},$$

where c is the speed of sound in air, and r is a predetermined constant of absorption per unit time delay which is one of frequency dependent and frequency independent.

14. The system of claim 13, wherein said signal modifying means are provided in both said first and second signal paths.

15. The system of claim 13, wherein said signal modifying means modify both gain and time delay of said signals.

16. A sound mixing system comprising first input means for receiving a plurality of input signals from a plurality of sources, first control means, panning means responsive to said first control means for modifying an input signal received through said first input means from one of the plurality of sources to a desired stereophonic representation, second control means, and distance simulation means responsive to said second control means to further modify said input signal processed by said panning means by producing a signal with simulated reflections characteristic of a desired simulated distance, wherein said distance simulation means comprises:

second input means for receiving the input signal from said panning means;

output mixing means for producing an output signal;

early reflection simulation means;

a first signal path connecting said second input means to said output mixing means;

a second signal path connecting said input means to an input of said early reflection simulation means and connecting an output of said early reflection simulation means to said output mixing means; and signal modifying means provided in one of said first and second signal paths and arranged to modify one of gain magnitude and time delay of signals in said signal path, thereby modifying a simulated distance parameter $d_S$;

said early reflection simulation means producing for each of the plurality of input signals S a multiplicity of delayed replicas of said input signal each having a time delay T relative to an arrival time via said first signal path of said input signal S to said output mixing means, and having a gain magnitude $g_S$ relative to gain via said first signal path of said input signal S at said output mixing means, said early reflection simulation means and said signal modifying means having in combination a gain/delay characteristic varying with the parameter $d_S$ corresponding to a simulated sound source distance, said gain/delay characteristic characterized by the following equation;

$$g_s=[1/(1+cT/d_S)]e^{-rT},$$

where c is the speed of sound in air, and r is a predetermined constant of absorption per unit time delay which is one of frequency dependent and frequency independent.

17. Audio signal processing system for processing input signals and outputting audio signals giving a simulated distance effect, comprising:

control means;

input means for receiving the input signals;

output mixing means for producing an output signal;

early reflection simulation means responsive to said control means;

a first signal path connecting said input means to said output mixing means;

a second signal path connecting said input means to an input of said early reflection simulation means and connecting an output of said early reflection simulation means to said output mixing means; and signal modifying means responsive to said control means, said signal modifying means provided in one of said first and second signal paths and arranged to modify one of gain magnitude and time delays of signals in said signal paths, said early reflection simulation means producing for each of the input signals S a multiplicity of delayed replicas of said input signal each having a time delay T relative to an arrival time via said first signal path of said input signal S to said output mixing means, and having a gain magnitude $g_S$, relative to a gain via said first signal path of said input signal S at said outside mixing means, and said signal modifying means producing modified gain magnitudes $g_S'$ and time delays T' to produce a modified simulated distance $d_S'$, said early reflection simulation means and said signal modifying means having in combination a gain/delay characteristic varying with a parameter $d_S$ corresponding to a simulated sound source distance, said gain/delay characteristic characterized by the following equation:

$$g_s'/g_s=(e^{-r'T'+rT})(1+cT/d_S)/(1+cT'/d_S')$$

where c is the speed of sound in air and r and r' are a predetermined respective original and final constants of absorption per unit time delay and both the original and final constants are one of frequency dependent and frequency.

18. The system of claim 17, wherein r and r' are frequency dependent.

19. Audio signal processing system according to claim 18, wherein each of the input signals is provided with a different simulated sound source distance while sharing the early reflection simulation means in the second signal path.

20. The system of claim 17, wherein said signal modifying means are provided in both said first and second signal paths.

21. The system of claim 17, wherein said signal modifying means modify both gain and time delay of said signals.

22. Audio signal processing system according to claim 17, wherein the difference between the time delays of simulated early reflections is independent of adjustment of said signal modifying means.

23. Audio signals processing system according to claim 17, wherein said early reflection simulation means and said signal modifying means affect all components of a source signal S passing through one of said first signal path and said second signal path so as to alter relative gains and delays between the two said signal paths.

24. Audio signal processing system according to claim 23, wherein said simulated source distance $d_S$ is obtained from an original simulated source distance d by said signal modifying means decreasing the relative delay of signals through said second signal path relative to said first signal path by a delay $(d_s-d)/c$ and by said signal modifying means multiplying the relative gains of signals through said second signal path relative to said first signal path by $(d_s/d)$exp where a decrease by said relative delay constitutes an increase in the relative gain.

25. Audio signal processing system according to claim 17, wherein said signal modifying means modifies the gain magnitudes $g_S'$ associated with a time delay T of a simulated reflection giving a first simulated distance $d_1$ by a factor with amplitude magnitude $$(1+cT/d_1)/(1+cT/d_2)$$

for every simulated reflection so as to provide a modified early reflection simulation means giving a predetermined second simulated distance $d_2$.

26. Audio signal processing system according to claim 25, wherein said factor with said amplitude magnitude is provided by a matrix means.

27. Audio signal processing system according claim 17, wherein a reproduced angular spread of the first signal path output of a sound source signal S is varied in response to the value of the simulated distance parameter $d_S$ set by the control means.

28. Audio signal processing system according to claim 17, wherein a perceived loudness of the audio signals is varied by determining at least one of equalization frequency and gain, of the first signal path output in response to the value of the simulated distance $d_S$ set by the control means.

29. Audio signal processing system according to claim 17, wherein an equalization of the first signal path output is varied in response to the value of the simulated distance $d_S$ set by the control means.

30. Audio signal processing system according to claim 17, wherein an energy gain of a simulated reverberant decay is varied in response to the value of the simulated distance $d_S$ set by the control means.

31. Audio signal processing system according to claim 17, wherein an equalization of a reproduced acoustic velocity of the first signal path output of an input signal S is varied in response to the value of the simulated distance $d_s$ set by the control means.

32. Audio signal processing system according to claim 17, wherein a time delay of the first signal path output of an input signal S is varied in response to the value of the simulated distance $d_s$ set by the control means.

33. Audio signal processing system according to claim 32, wherein said control means produces a simulated Döppler effect in said first signal path output.

34. Audio signal processing system according to claim 17, wherein the control means includes a plurality of channels and means for panning the input signals within said plurality of channels to control a directional effect.

35. Audio signal processing system according to claim 17, wherein each of the input signals S is provided with a different simulated sound source distance while sharing the early reflection simulation means in said second signal path.

36. Audio signal processing system according to claim 17, in which the deviation of said gains $g_S'$ from said formula is not greater than 3 dB except when isolated said delayed replicas of said input signal overlap in time cause a greater deviation than 3 b.

37. Audio signal processing system according to claim 17, in which said early reflection simulation means is additionally provided with energy-preserving linear signal processing means not introducing psychoacoustically significant time delay or attenuation of transients discernable to the human ear.

38. Audio signal processing system for processing input signals and outputting,an audio signal giving a simulated distance effect, comprising:

input means for receiving the input signals;

output miming means for producing an output signal;

early reflection simulation means;

a first signal path connecting said input means to said output mixing means;

a second signal path connecting said input means to an input of said early reflection simulation means and connecting an output of said early reflection simulation means to said output mixing means; and signal modifying means provided in one of said first and second signal paths and arranged to modify one of gain magnitude and time delays of signals in said signal path, said early reflection simulation means producing, for each of a plurality of input signals S from said input means, a multiplicity of delayed replicas of said input signal each having a time delay T relative to an arrival time via said first signal path of said input signal S at said output miming means, and having a gain magnitude $g_S$ relative to a gain via said first signal path of said input signal S at said output mixing means, and said signal modifying means producing modified gain magnitudes $g_S'$ and time delays T' to produce a modified simulated distance $d_S'$, said early reflection simulation means and said signal modifying means having in combination a gain/delay characteristic varying with a parameter $d_S$ corresponding to a simulated sound source distance, said gain/delay characteristic characterized by the following equation:

$$g_s'/g_s=(e^{-r'(t'-t)}(1+cT/d_S)/(1+cT'/d_S')$$

where c is the speed of sound in air and r is a predetermined constant of absorption per unit time delay and r' is a predetermined constant of absorption per unit time delay and is one of frequency dependent and frequency of independent.

39. The system of claim 38, wherein r is frequency dependent.

* * * * *